(12) United States Patent
Hashiguchi

(10) Patent No.: US 12,027,176 B2
(45) Date of Patent: Jul. 2, 2024

(54) APPARATUS AND METHOD FOR REDUCING NOISE CORRESPONDING TO A NOISE SOURCE USING NOISE DATA

(71) Applicant: CANON KABUSHIKI KAISHA, Tokyo (JP)

(72) Inventor: Aoi Hashiguchi, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 134 days.

(21) Appl. No.: 17/739,694

(22) Filed: May 9, 2022

(65) Prior Publication Data

US 2022/0383890 A1 Dec. 1, 2022

(30) Foreign Application Priority Data

May 31, 2021 (JP) .................. 2021-091350

(51) Int. Cl.
| | | |
|---|---|---|
| H04R 1/40 | (2006.01) | |
| G10L 21/0232 | (2013.01) | |
| G10L 25/18 | (2013.01) | |
| H04R 1/02 | (2006.01) | |
| H04R 3/00 | (2006.01) | |
| G10L 21/0216 | (2013.01) | |
| H03G 3/20 | (2006.01) | |

(52) U.S. Cl.
CPC .......... *G10L 21/0232* (2013.01); *G10L 25/18* (2013.01); *H04R 1/028* (2013.01); *H04R 1/406* (2013.01); *H04R 3/005* (2013.01); *G10L 2021/02165* (2013.01); *H03G 3/20* (2013.01); *H04R 2410/01* (2013.01); *H04R 2410/05* (2013.01); *H04R 2499/11* (2013.01)

(58) Field of Classification Search
None
See application file for complete search history.

(56) References Cited

U.S. PATENT DOCUMENTS

| | | | | |
|---|---|---|---|---|
| 6,639,986 B2* | 10/2003 | Kanamori | .............. | H04R 3/005 |
| | | | | 381/71.1 |
| 2011/0313763 A1* | 12/2011 | Amada | .................. | H04R 3/005 |
| | | | | 381/92 |
| 2015/0281834 A1* | 10/2015 | Takano | .................. | H04R 1/326 |
| | | | | 381/92 |
| 2018/0350385 A1* | 12/2018 | Tsujimoto | .............. | H04N 5/911 |
| 2019/0057711 A1* | 2/2019 | Toriumi | .............. | G10L 21/0232 |

FOREIGN PATENT DOCUMENTS

JP        2010141571 A     6/2010

* cited by examiner

*Primary Examiner* — James K Mooney
(74) *Attorney, Agent, or Firm* — CANON U.S.A., INC. IP Division

(57) ABSTRACT

An apparatus includes a CPU and a memory storing a program that causes the apparatus to function as the following units. A first amplification unit that amplifies a the sound signal from a first microphone for acquiring an environment sound, a second amplification unit that amplifies a sound signal from a second microphone for acquiring a noise of a noise source in accordance with a amplification amount, a conversion unit that performs Fourier transform on sound signals from the first amplification unit and the second amplification unit, a reduction unit that reduces noise from first sound data using noise data. The amplification amount is set based on at least one of a level of the sound signal from the second amplification unit and a type of the noise source.

8 Claims, 14 Drawing Sheets

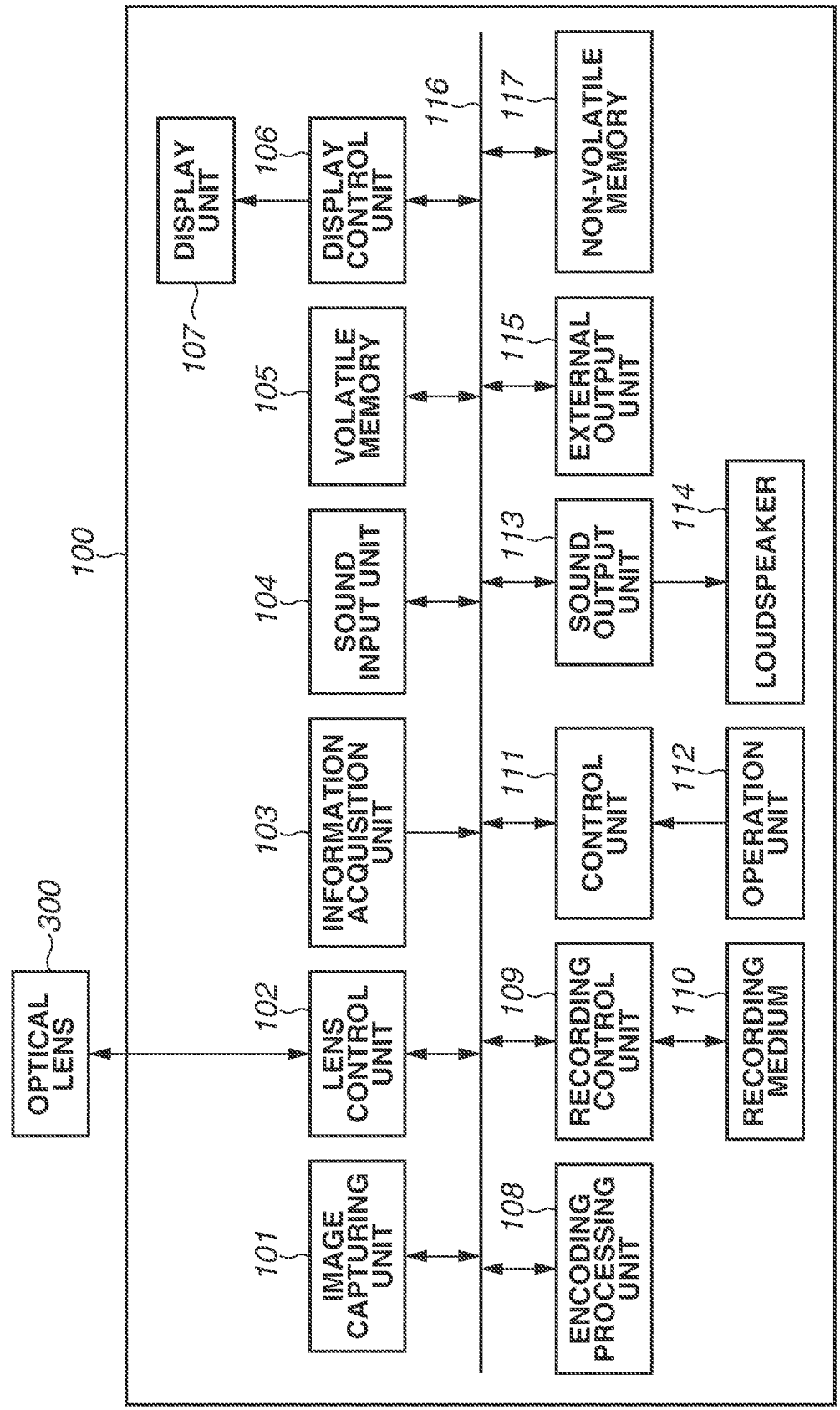

FIG.9

| NAME | TYPE OF NOISE | [0] | [1] | [2] | ... | [N-1] | [N] | [N+1] | ... | [511] | [512] |
|---|---|---|---|---|---|---|---|---|---|---|---|
| PL1 | WHITE NOISE | 0 | 0 | 0 | ... | 0.20 | 0.18 | 0.21 | ... | 0 | 0 |
| PL2 | SHORT-TERM NOISE | 0 | 0 | 0 | ... | 0.85 | 0.86 | 0.88 | ... | 0 | 0 |
| PL3 | LONG-TERM NOISE | 0 | 0 | 0 | ... | 0.80 | 0.79 | 0.85 | ... | 0 | 0 |
| | ... | | | | | | | | | | |
| PLx | OTHER NOISE | 0 | 0 | 0 | ... | 0.61 | 0.78 | 0.90 | ... | 0 | 0 |
| PR1 | WHITE NOISE | 0 | 0 | 0 | ... | 0.20 | 0.17 | 0.22 | ... | 0 | 0 |
| PR2 | SHORT-TERM NOISE | 0 | 0 | 0 | ... | 0.85 | 0.86 | 0.88 | ... | 0 | 0 |
| PR3 | LONG-TERM NOISE | 0 | 0 | 0 | ... | 0.81 | 0.78 | 0.86 | ... | 0 | 0 |
| | ... | | | | | | | | | | |
| PRx | OTHER NOISE | 0 | 0 | 0 | ... | 0.66 | 0.81 | 0.88 | ... | 0 | 0 |
| PN1 | QUANTIZATION NOISE | 0 | 0 | 0 | ... | 0.58 | 0.61 | 0.57 | ... | 0 | 0 |

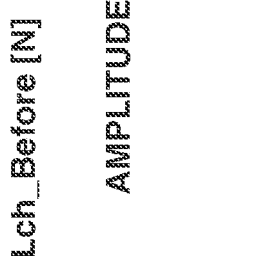
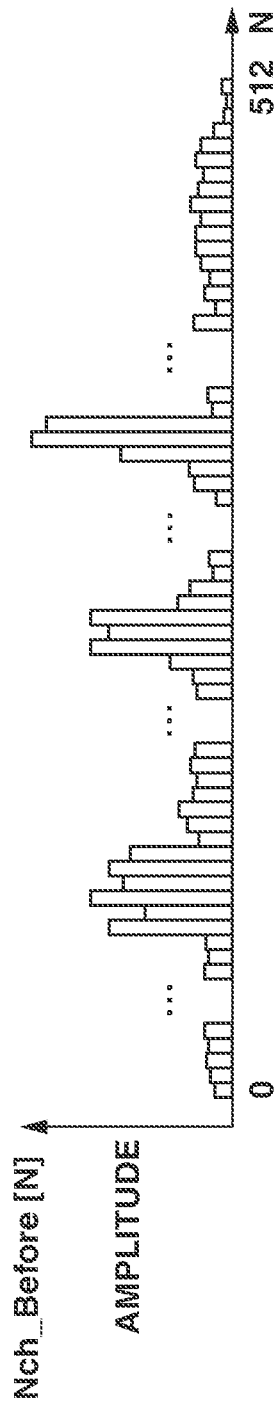
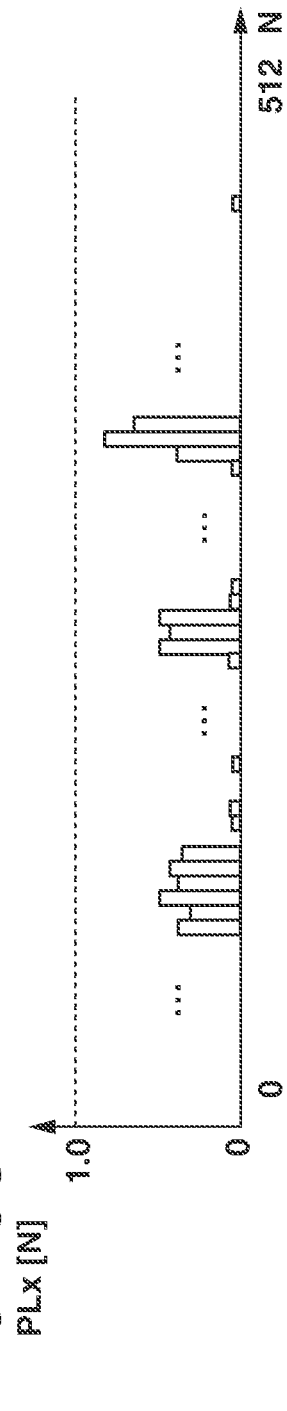

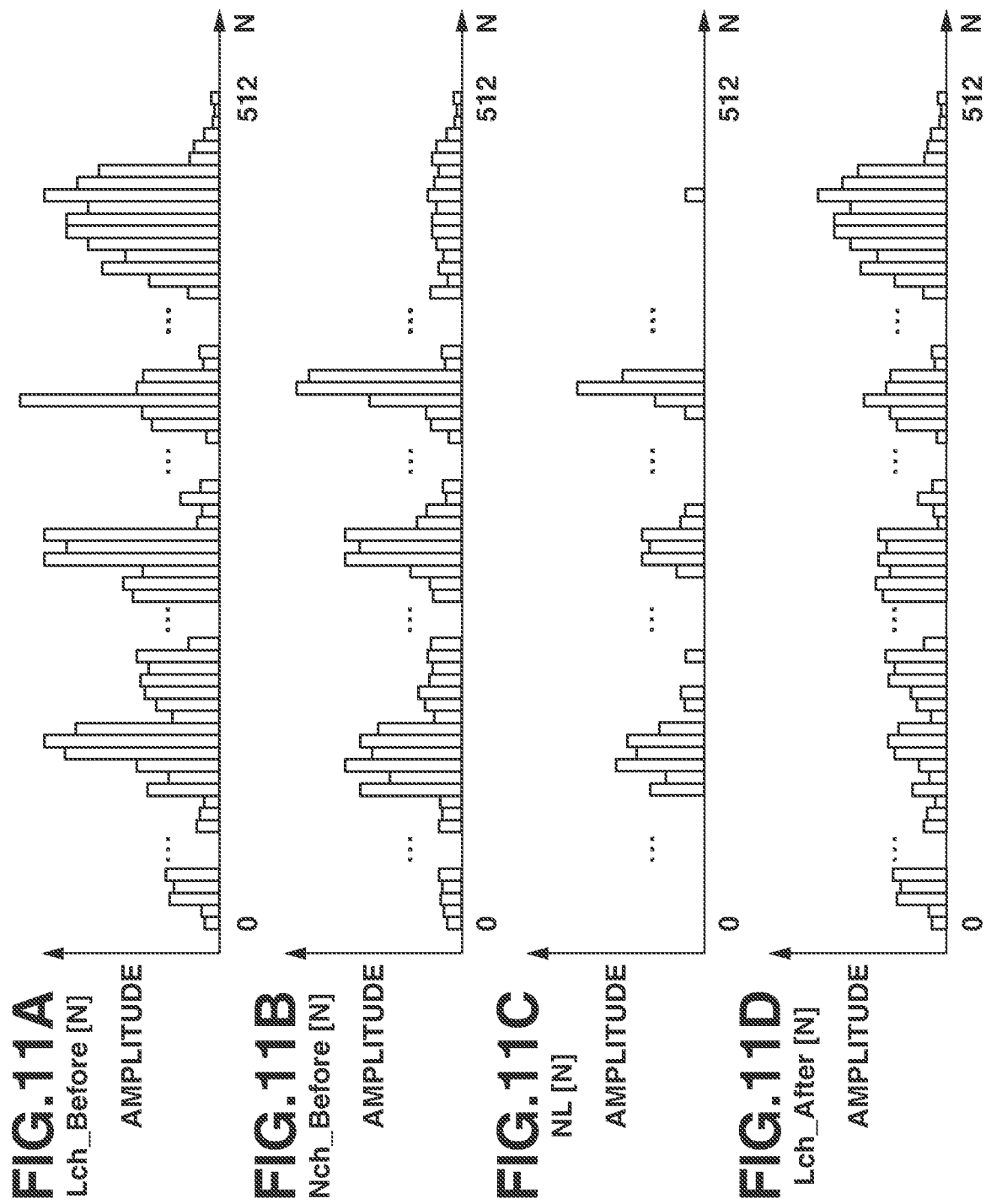

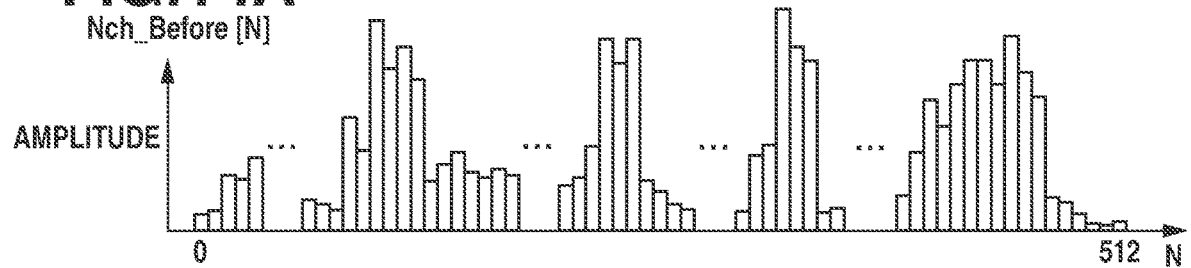
FIG.14A Nch_Before [N]
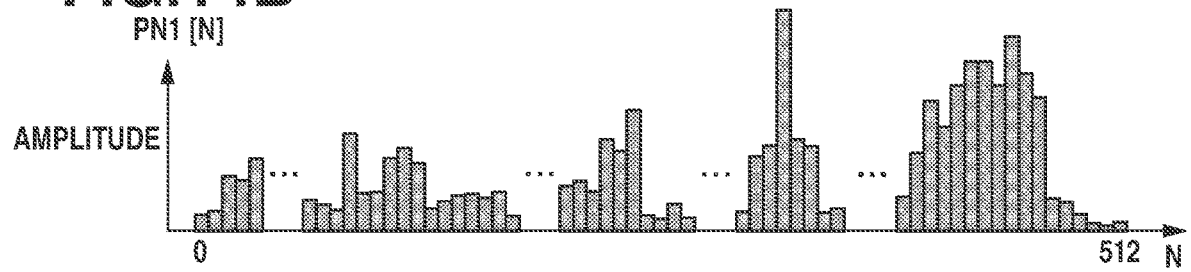
FIG.14B PN1 [N]
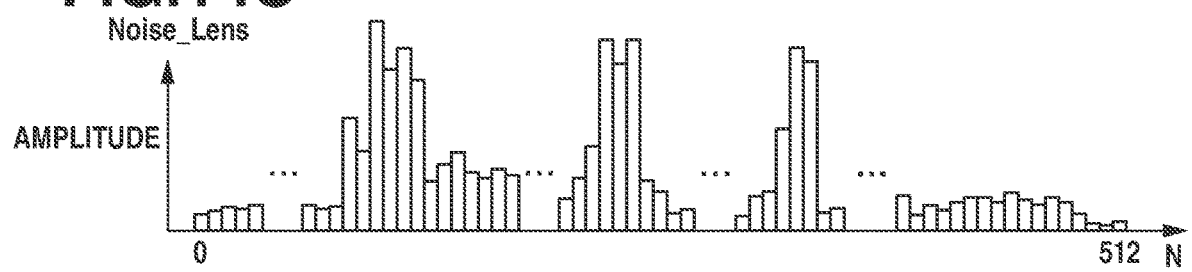
FIG.14C Noise_Lens
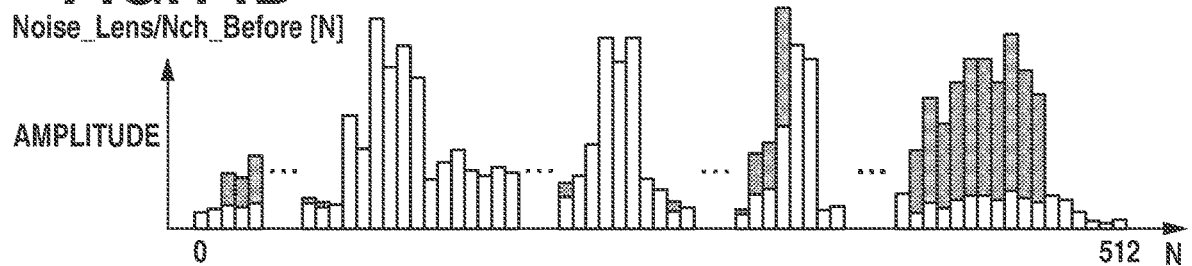
FIG.14D Noise_Lens/Nch_Before [N]
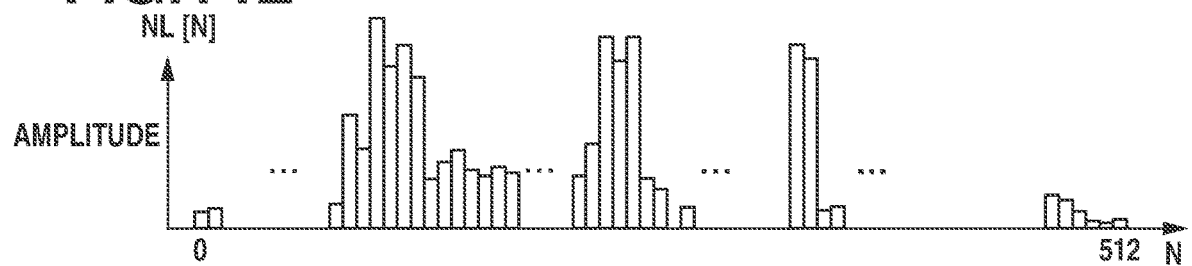
FIG.14E NL [N]

APPARATUS AND METHOD FOR REDUCING NOISE CORRESPONDING TO A NOISE SOURCE USING NOISE DATA

BACKGROUND

Technical Field

The aspect of the embodiments relates to a sound processing apparatus.

Description of the Related Art

In a case where moving image data is recorded using a digital camera as an example of a sound processing apparatus, the digital camera can record a sound around the digital camera together with the moving image data. Digital cameras also have an autofocus function which is for driving an optical lens to adjust the focus on an object while recording moving image data. Further, digital cameras have a different function for driving the optical lens to perform zooming during moving image recording.

In a case where the optical lens is driven during moving image recording, a driving sound of the optical lens may be included as noise in a sound of the moving image and recorded. Hereinafter, the driving sound of the optical lens recorded as noise will be referred to as a "driving noise". In a case where a driving noise is collected, the digital camera can reduce the driving noise and record a sound around the digital camera. Japanese Patent Application Laid-Open No. 2010-141571 discusses a technique for changing the amount of analog gain for amplifying a sound in accordance with a setting value of a sound volume, to reduce sound distortion and sound clipping.

In a case of an interchangeable lens digital camera, levels of driving noise vary depending on an attached optical lens. Further, for example, even during driving of the attached optical lens, there are a time period when the driving noise is great and a time period when the driving noise is small. If an amplification process is uniformly performed on a sound signal including such noise regardless of levels of the noise, the sound signal may be distorted or quantization noise may be generated, which may result in decrease in quality of the sound signal.

SUMMARY

According to an aspect of the embodiments, an apparatus includes a first microphone that acquires an environmental sound, a second microphone that acquires a noise of a noise source, a central processing unit (CPU), a memory that stores a program that, when executed by the CPU, causes the apparatus to function as: a first amplification unit configured to amplify a sound signal output from the first microphone, a second amplification unit configured to amplify a sound signal output from the second microphone, in accordance with an amplification amount, the amplification amount being set based on at least one of a level of the sound signal output from the second amplification unit and a type of the noise source, a first conversion unit configured to perform Fourier transform on the sound signal output from the first amplification unit, to generate first sound data, a second conversion unit configured to perform Fourier transform on the sound signal output from the second amplification unit, to generate second sound data, a reduction unit configured to generate noise data based on the second sound data and reduce noise corresponding to the noise source from the first sound data using the noise data, and a third conversion unit configured to perform inverse Fourier transform on the first sound data output from the reduction unit.

Further features of the disclosure will become apparent from the following description of exemplary embodiments with reference to the attached drawings.

BRIEF DESCRIPTION OF THE DRAWINGS

FIG. 2 is a block diagram illustrating a configuration of the imaging apparatus according to the present exemplary embodiment.

FIG. 9 is a diagram illustrating noise parameters according to the present exemplary embodiment.

FIGS. 10A to 10C. are diagrams illustrating frequency spectra of sounds and a frequency spectrum of a noise parameter in a case where a driving sound is generated in a situation where it can be considered that there is no environmental sound, according to the present exemplary embodiment.

FIGS. 11A to 11D are diagrams illustrating frequency spectra of sounds in a case where a driving sound is generated in a situation where there is an environmental sound, according to the present exemplary embodiment.

FIGS. 14A to 14E are diagrams illustrating frequency spectra of sounds in a case where a sound signal of a sound collected by the noise microphone is influenced by quantization noise, according to the present exemplary embodiment.

DESCRIPTION OF THE EMBODIMENTS

With reference to the drawings, exemplary embodiments of the disclosure will be described in detail below.

<External Views of Imaging Apparatus 100>

Figure 1A:
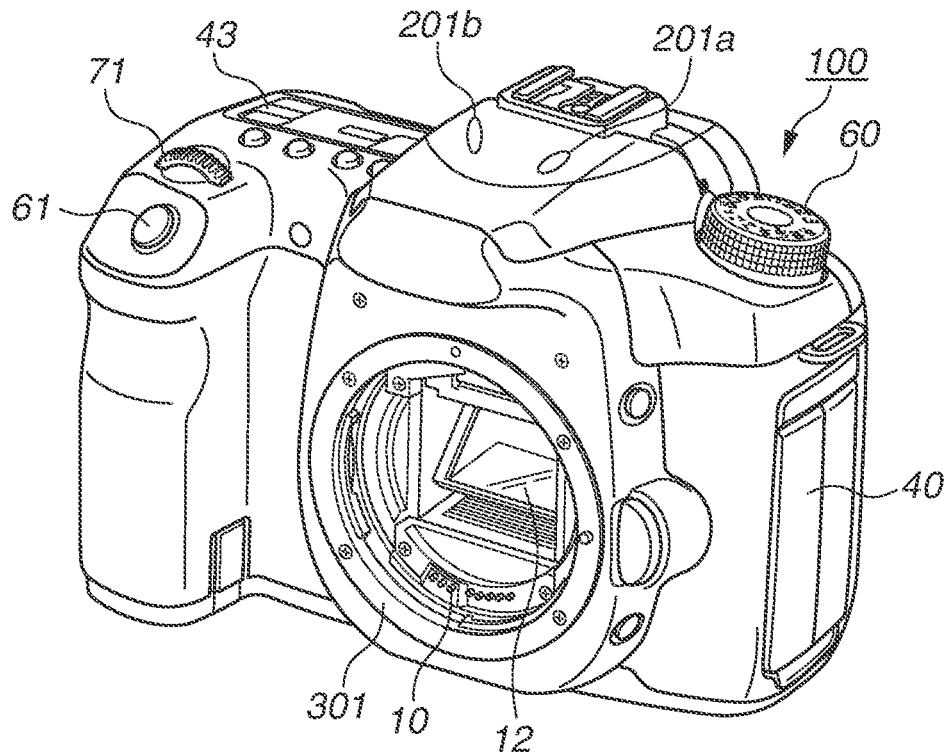
FIGS. 1A and 1B are perspective views illustrating an imaging apparatus according to the present exemplary embodiment.
Figure 1B:
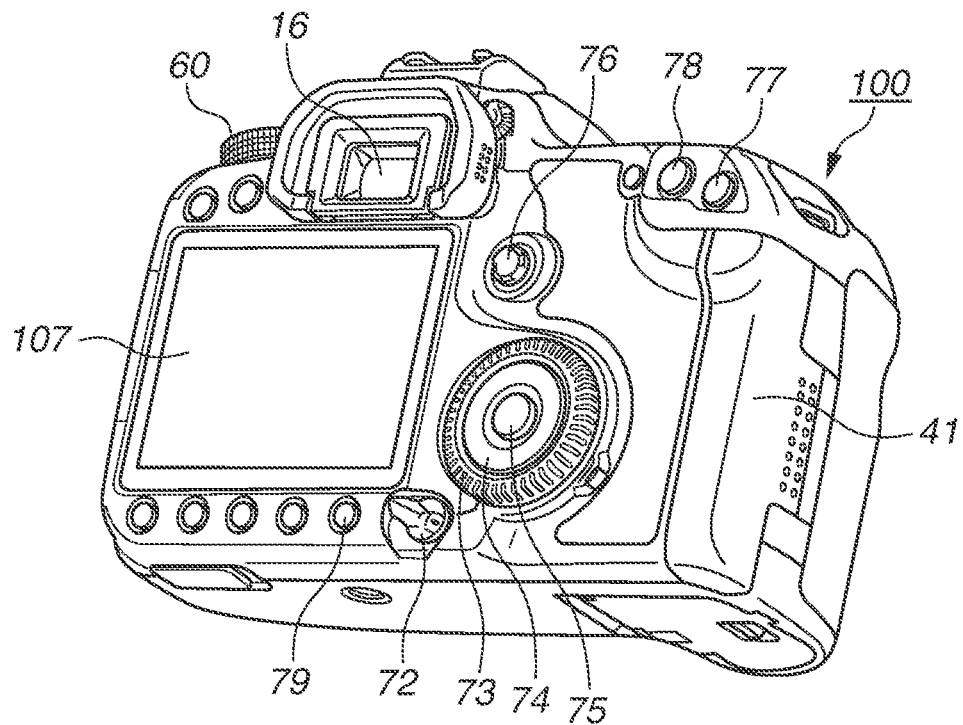

FIGS. 1A and 1B illustrate examples of external views of an imaging apparatus 100 as an example of a sound processing apparatus to which the present exemplary embodiment is applicable. FIG. 1A is an example of a front perspective view of the imaging apparatus 100. FIG. 1B is an example of a rear perspective view of the imaging apparatus 100. In FIGS. 1A and 1B, an optical lens (not illustrated) is attached to a lens mount 301.

A display unit 107 displays image data and text information. The display unit 107 is provided on the back surface of the imaging apparatus 100. An outside-viewfinder display unit 43 is a display unit provided on the upper surface of the imaging apparatus 100. The outside-viewfinder display unit 43 displays the setting values, such as a shutter speed and a stop value, of the imaging apparatus 100. An eyepiece viewfinder 16 is a look-in type viewfinder. A user observes a focusing screen in the eyepiece viewfinder 16 to check the focus of the optical lens and composition of an optical image of an object.

A release switch 61 is an operation member for receiving an image capturing instruction from the user. A mode selection switch 60 is an operation member for receiving an instruction from the user to switch to various modes. A main electronic dial 71 is a rotary operation member. The user rotates the main electronic dial 71 to change setting values, such as a shutter speed and a stop value, of the imaging apparatus 100. The release switch 61, the mode selection switch 60, and the main electronic dial 71 are included in an operation unit 112.

A power switch 72 is an operation member for receiving instructions from the user to turn on and off the imaging apparatus 100. A sub electronic dial 73 is a rotary operation member. The user operates the sub electronic dial 73 to move a selection frame displayed on the display unit 107 and advance an image in a reproduction mode. A directional pad 74 is a directional pad of which upper, lower, left, and right portions can be pushed in (a four-direction key). The imaging apparatus 100 executes processing according to a pushed portion (direction) of the directional pad 74. The power switch 72, the sub electronic dial 73, and the directional pad 74 are included in the operation unit 112.

A SET button 75 is a push button. The SET button 75 is used by the user mainly to determine a selection item displayed on the display unit 107. An LV button 76 is a button for use in switching on and off states of live view (hereinafter, "LV"). The LV button 76 is a button for use in issuing instructions to start and stop capturing (recording) of a moving image in a moving image recording mode. An enlargement button 77 is a push button for receiving instructions from the user to, in live view display in an image capturing mode, turn on and off an enlargement mode and change an enlargement ratio in the enlargement mode. The SET button 75, the LV button 76, and the enlargement button 77 are included in the operation unit 112.

In the reproduction mode, the enlargement button 77 functions as a button for receiving an instruction from the user to increase an enlargement ratio of image data displayed on the display unit 107. A reduction button 78 is a button for receiving an instruction from the user to reduce the enlargement ratio of the enlarged image data displayed on the display unit 107. A reproduction button 79 is an operation button for receiving an instruction from the user to switch the image capturing mode and the reproduction mode. In a case where the user presses the reproduction button 79 in the image capturing mode of the imaging apparatus 100, the imaging apparatus 100 transitions to the reproduction mode, and the display unit 107 displays image data recorded in a recording medium 110. The reduction button 78 and the reproduction button 79 are included in the operation unit 112.

An instant return mirror 12 (hereinafter, "mirror 12") is a mirror for switching a direction of a light beam incident from an optical lens attached to the imaging apparatus 100 to guide the light beam to either of the eyepiece viewfinder 16 and an image capturing unit 101. The mirror 12 is moved up and down by a control unit 111 controlling an actuator (not illustrated) in a case where exposure is performed, LV image capturing is performed, or moving image capturing is performed. Normally, the mirror 12 is disposed to a position by which the light beam is guided to the eyepiece viewfinder 16. In a case where image capturing is performed or LV displaying is performed, the mirror 12 is flipped up to guide the light beam to the image capturing unit 101 (mirror-up).

A center portion of the mirror 12 is a half mirror. A part of the light beam passed through the center portion of the mirror 12 enters a focus detection unit (not illustrated) for detecting a focus.

A communication terminal 10 is a communication terminal for use in communication between an optical lens 300 attached to the imaging apparatus 100 and the imaging apparatus 100. A terminal cover 40 is a cover for protecting a connection cable connector (not illustrated) for a connection cable which connects an external device to the imaging apparatus 100. A cover 41 is a cover of a slot in which the recording medium 110 is stored. The lens mount 301 is an attachment portion to which the optical lens 300 (not illustrated) can be attached.

An L-microphone 201a and an R-microphone 201b are microphones for collecting a voice of the user. When viewed from the back surface of the imaging apparatus 100, the L-microphone 201a is placed on the left side, and the R-microphone 201b is placed on the right side.

<Configuration of Imaging Apparatus 100>

FIG. 2 is a block diagram illustrating an example of the configuration of the imaging apparatus 100.

The optical lens 300 is a lens unit attachable to and detachable from the imaging apparatus 100. For example, the optical lens 300 is a zoom lens or a varifocal lens. The optical lens 300 includes an optical lens, a motor that drives the optical lens, and a communication unit that communicates with a lens control unit 102 (described below) of the imaging apparatus 100. The optical lens 300 moves the optical lens using the motor based on a control signal received by the communication unit, whereby focusing and zooming on an object and correcting camera shake can be performed.

The image capturing unit 101 includes an image sensor for converting an object optical image, passed through the optical lens 300 and formed on an imaging surface, into an electric signal, and an image processing unit for generating image data or moving image data from the electric signal generated by the image sensor and outputs the image data or the moving image data. The image sensor is, for example, a charge-coupled device (CCD) or a complementary metal-oxide-semiconductor (CMOS). A series of processes in which the image capturing unit 101 generates and outputs image data including still image data and moving image data is referred to as "image capturing". In the imaging apparatus 100, the image data is recorded in the recording medium 110 according to the Design Rule for Camera File system (DCF) standard.

Based on data output from the image capturing unit 101 and a control signal output from the control unit 111, the lens control unit 102 transmits a control signal to the optical lens 300 via the communication terminal 10, to control the optical lens 300.

An information acquisition unit 103 detects tilting of the imaging apparatus 100 and a temperature inside of a housing of the imaging apparatus 100. For example, the information acquisition unit 103 detects tilting of the imaging apparatus 100 using an acceleration sensor or a gyro sensor. The information acquisition unit 103 detects the temperature inside of the housing of the imaging apparatus 100 using a temperature sensor, for example.

A sound input unit 104 generates sound data from a sound acquired by a microphone. The sound input unit 104 acquires a sound around the imaging apparatus 100 using the microphone. The sound input unit 104 performs analog-to-digital conversion (A/D conversion) and various types of sound processing on the acquired sound, to generate sound data. The sound input unit 104 includes a microphone. An example of the detailed configuration of the sound input unit 104 will be described below.

A volatile memory 105 temporarily records image data generated by the image capturing unit 101 and sound data generated by the sound input unit 104. The volatile memory 105 is also used as a temporary recording area for image data to be displayed on the display unit 107 and a work area for the control unit 111.

A display control unit 106 performs control to display image data output from the image capturing unit 101, text for an interactive operation, a menu screen, and the like, on the display unit 107. During still image capturing or moving image capturing, the display control unit 106 performs control to sequentially display image data output from the image capturing unit 101 on the display unit 107, whereby the display unit 107 can function as an electronic viewfinder. The display unit 107 is, for example, a liquid crystal display or an organic electroluminescent (EL) display. The display control unit 106 can also perform control to display image data and moving image data output from the image capturing unit 101, text for an interactive operation, a menu screen, and the like, on an external display via an external output unit 115.

An encoding processing unit 108 can encode image data and sound data temporarily recorded in the volatile memory 105. For example, the encoding processing unit 108 can generate moving image data by encoding and compressing image data according to the Joint Photographic Experts Group (JPEG) standard or a raw image format. Further, the encoding processing unit 108 can generate moving image data by encoding and compressing moving image data according to the Moving Picture Experts Group (MPEG)-2 standard or the H.264/MPEG4-Advanced Video Coding (AVC) standard. Furthermore, the encoding processing unit 108 can generate sound data by encoding and compressing sound data according to the Audio Code number 3 (AC3) standard, the Advanced Audio Coding (AAC) standard, the Adaptive Transform Acoustic Coding (ATRAC) standard, or an adaptive differential pulse-code modulation (ADPCM) method. The encoding processing unit 108 may encode sound data without compressing sound data, according to a linear pulse-code modulation (PCM) method.

A recording control unit 109 can record data in the recording medium 110 and read the data from the recording medium 110. For example, the recording control unit 109 can record still image data, moving image data, and sound data generated by the encoding processing unit 108 in the recording medium 110. The recording control unit 109 can also read the still image data, the moving image data, and the sound data from the recording medium 110. The recording medium 110 is, for example, a Secure Digital (SD) card, a CompactFlash (CF) card, an XQD memory card, a hard disk drive (HDD) (a magnetic disk), an optical disc, or a semiconductor memory. The recording medium 110 may be configured to be attachable to and detachable from the imaging apparatus 100 using an attachment/ejection mechanism (not illustrated), or may be built into the imaging apparatus 100. More specifically, the recording control unit 109 has any method for accessing the recording medium 110.

According to an input signal and a program described below, the control unit 111 controls the components of the imaging apparatus 100 via a data bus 116. The control unit 111 includes a central processing unit (CPU) as a hardware processor that executes various types of control, a read-only memory (ROM), and a random-access memory (RAM). Instead of the control unit 111 controlling the entire operation of the imaging apparatus 100, a plurality of pieces of hardware may control the imaging apparatus 100 in a shared manner.

The ROM included in the control unit 111 stores a program for controlling the components. The RAM included in the control unit 111 is a volatile memory that is used for a calculation process and the like.

The operation unit 112 is a user interface for receiving an instruction to the imaging apparatus 100 from the user. The operation unit 112 includes, for example, the power switch 72 for receiving instructions to turn on and off the imaging apparatus 100, the release switch 61 for receiving an instruction to capture an image, the reproduction button 79 for receiving an instruction to reproduce image data or moving image data, and the mode selection switch 60.

According to an operation of the user, the operation unit 112 outputs a control signal to the control unit 111. A touch panel included in the display unit 107 can also be included in the operation unit 112. The release switch 61 includes switches SW1 and SW2 (not illustrated). The release switch 61 enters a so-called half press state in which the switch SW1 is turned on. In response to the half pressing, the operation unit 112 receives a preparation instruction to perform a preparation operation for capturing an image, such as an autofocus (AF) process, an automatic exposure (AE) process, an automatic white balance (AWB) process, or a pre-flash (EF) process. The release switch 61 enters a so-called full press state in which the switch SW2 is turned on. In response to such a user operation, the operation unit 112 receives an image capturing instruction to perform an image capturing operation. The operation unit 112 also includes an operation member (e.g., a button) with which the user can adjust the sound volume of sound data reproduced from a loudspeaker 114.

A sound output unit 113 can output sound data to the loudspeaker 114 and the external output unit 115. Sound data to be input to the sound output unit 113 is sound data read from the recording medium 110 by the recording control unit 109, sound data output from a non-volatile memory 117, or sound data output from the encoding processing unit 108. The loudspeaker 114 is an electroacoustic converter capable of reproducing sound data.

The external output unit 115 can output image data, moving image data, and sound data to an external device. The external output unit 115 includes, for example, a video terminal, a microphone terminal, and a headphone terminal.

The data bus 116 is a data bus for transmitting various types of data, such as sound data, moving image data, and image data, and various control signals to the blocks of the imaging apparatus 100.

The non-volatile memory 117 is a non-volatile memory for storing a program described below that is executed by the control unit 111. In the non-volatile memory 117, sound data is recorded. The sound data is sound data on an electronic sound, such as a focusing sound that is output from the loudspeaker 114 in a case where the focus of the lens is adjusted on the object, an electronic shutter sound that is output from the loudspeaker 114 in a case where an instruction to capture an image is received, or an operation sound that is output from the loudspeaker 114 in a case where the imaging apparatus 100 is operated.

<Operations of Imaging Apparatus 100>

The operations of the imaging apparatus 100 are described.

In response to an instruction to turn on the imaging apparatus 100 from the user operating the power switch 72, the imaging apparatus 100 according to the present exemplary embodiment supplies power from a power supply (not illustrated) to the components of the imaging apparatus 100. For example, the power supply is a battery, such as a lithium-ion battery and an alkaline manganese dry battery.

According to the supply of power, the control unit 111 determines an operation mode of the imaging apparatus 100 based on a state of the mode selection switch 60. For example, the control unit 111 determines which operation mode between the image capturing mode and the reproduction mode the imaging apparatus 100 is to operate. In the moving image recording mode, the control unit 111 performs control to record moving image data output from the image capturing unit 101 and sound data output from the sound input unit 104 as a single piece of moving image data with sound. In the reproduction mode, the control unit 111 controls the recording control unit 109 to read image data or moving image data recorded in the recording medium 110 and controls the display unit 107 to display the image data or the moving image data.

A description will be given of the moving image recording mode. In the moving image recording mode, first, the control unit 111 transmits a control signal to the components of the imaging apparatus 100 to cause the imaging apparatus 100 to transition to an image capturing standby state. More specifically, the control unit 111 controls the image capturing unit 101 and the sound input unit 104 to perform the following operations.

The image capturing unit 101 causes the image sensor to convert an object optical image, passed through the optical lens 300 and formed on the imaging surface, into an electric signal and generates moving image data from the electric signal generated by the image sensor. Then, the image capturing unit 101 transmits the moving image data to the display control unit 106, and the display unit 107 displays the moving image data. The user can prepare to capture an image while viewing the moving image data displayed on the display unit 107.

The sound input unit 104 performs A/D conversion on analog sound signals input from a plurality of microphones, to generate a plurality of digital sound signals. Then, the sound input unit 104 generates sound data with a plurality of channels from the plurality of digital sound signals. The sound input unit 104 transmits the generated sound data to the sound output unit 113 and causes the loudspeaker 114 to reproduce the sound data. While listening to the sound data reproduced from the loudspeaker 114, the user uses the operation unit 112 to adjust the sound volume of the sound data recorded in moving image data with sound.

Next, in response to the user pressing the LV button 76, the control unit 111 transmits an instruction signal for starting image capturing to the components of the imaging apparatus 100. For example, the control unit 111 controls the image capturing unit 101, the sound input unit 104, the encoding processing unit 108, and the recording control unit 109 to perform the following operations.

The image capturing unit 101 causes the image sensor to convert an object optical image, passed through the optical lens 300 and formed on the imaging surface, into an electric signal and generates moving image data from the electric signal generated by the image sensor. Then, the image capturing unit 101 transmits the moving image data to the display control unit 106, and the display unit 107 displays the moving image data. The image capturing unit 101 also transmits the generated moving image data to the volatile memory 105.

The sound input unit 104 performs A/D conversion on analog sound signals input from a plurality of microphones, to generate a plurality of digital sound signals. Then, the sound input unit 104 generates sound data with multiple channels from the plurality of digital sound signals. Then, the sound input unit 104 transmits the generated sound data to the volatile memory 105.

The encoding processing unit 108 reads and encodes moving image data and sound data temporarily recorded in the volatile memory 105. The control unit 111 generates a data stream from the moving image data and the sound data encoded by the encoding processing unit 108 and outputs the data stream to the recording control unit 109. According to a file system, such as Universal Disk Format (UDF) or File Allocation Table (FAT), the recording control unit 109 records the input data stream as moving image data with sound in the recording medium 110.

The components of the imaging apparatus 100 continue performing the above-described operations during moving image capturing.

Then, in response to the user pressing the LV button 76, the control unit 111 transmits an instruction signal for ending the image capturing to the components of the imaging apparatus 100. More specifically, the control unit 111 controls the image capturing unit 101, the sound input unit 104, the encoding processing unit 108, and the recording control unit 109 to perform the following operations.

The image capturing unit 101 stops the generation of the moving image data. The sound input unit 104 stops the generation of the sound data.

The encoding processing unit 108 reads and encodes the remaining moving image data and sound data recorded in the volatile memory 105. The control unit 111 generates a data stream from the moving image data and the sound data encoded by the encoding processing unit 108 and outputs the data stream to the recording control unit 109.

According to a file system, such as UDF or FAT, the recording control unit 109 records the data stream as a file of moving image data with sound in the recording medium 110. Then, in response to stopping inputting of the data stream, the recording control unit 109 finalizes the moving image data with sound. In response to the finalization of the moving image data with sound, the recording operation of the imaging apparatus 100 ends.

In response to the ending of the recording operation, the control unit 111 transmits a control signal to the components of the imaging apparatus 100 to cause the imaging apparatus 100 to transition to the image capturing standby state. Thus, the control unit 111 controls the imaging apparatus 100 to return to the image capturing standby state.

A description will be given of the reproduction mode. In the reproduction mode, the control unit 111 transmits a control signal to the components of the imaging apparatus 100 to cause the imaging apparatus 100 to transition to a reproduction state. For example, the control unit 111 controls the encoding processing unit 108, the recording control unit 109, the display control unit 106, and the sound output unit 113 to perform the following operations.

The recording control unit 109 reads moving image data with sound recorded in the recording medium 110 and transmits the read moving image data with sound to the encoding processing unit 108.

The encoding processing unit 108 decodes the moving image data with sound into image data and sound data. The encoding processing unit 108 transmits the decoded image data to the display control unit 106 and the decoded sound data to the sound output unit 113.

The display control unit 106 causes the display unit 107 to display the decoded image data. The sound output unit 113 causes the loudspeaker 114 to reproduce the decoded sound data.

As described above, the imaging apparatus 100 according to the present exemplary embodiment can record and reproduce image data and sound data.

In the present exemplary embodiment, the sound input unit 104 executes sound processing, such as a process of adjusting an amplitude of a sound signal input from a microphone. In response to starting moving image recording, the sound input unit 104 executes the sound processing. Alternatively, the sound processing may be executed after the imaging apparatus 100 is turned on. Yet alternatively, the sound processing may be executed in response to selection of the image capturing mode. Yet alternatively, the sound processing may be executed in response to selection of the moving image recording mode or a mode relating to sound recording, such as a voice memo function. Yet alternatively, the sound processing may be executed in response to starting recording of a sound signal.

<Configuration of Sound Input Unit 104>

Figure 3:
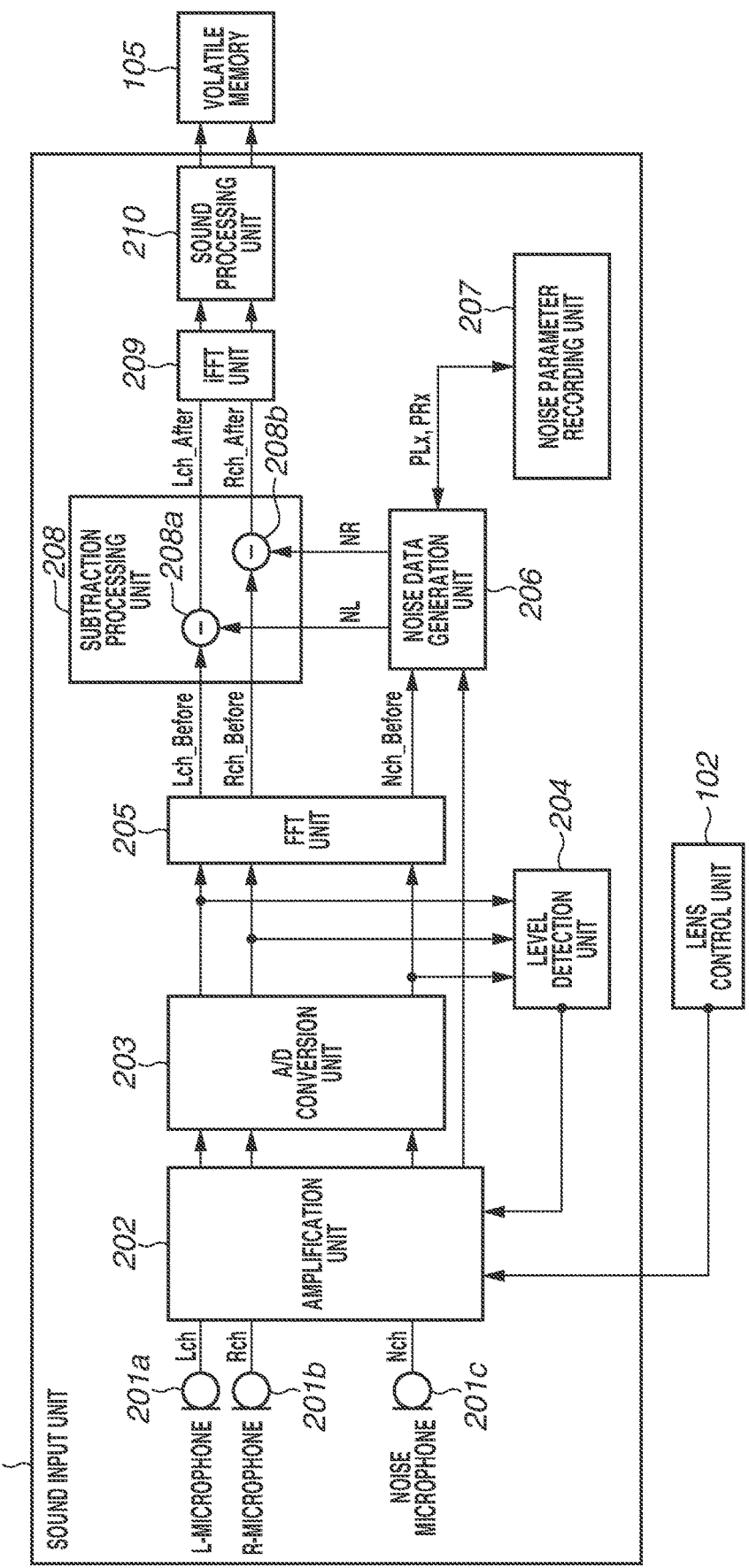
FIG. 3 is a block diagram illustrating a configuration of a sound input unit of the imaging apparatus according to the present exemplary embodiment.

FIG. 3 is a block diagram illustrating an example of a detailed configuration of the sound input unit 104.

The sound input unit 104 includes three microphones, which are the L-microphone 201a, the R-microphone 201b, and a noise microphone 201c. Each of the L-microphone 201a and the R-microphone 201b is an example of a first microphone. The imaging apparatus 100 collects an environmental sound using the L-microphone 201a and the R-microphone 201b and records sound signals input from the L-microphone 201a and the R-microphone 201b, using a stereo method. Examples of the environmental sound include a sound, such as a voice of the user, animal sounds, rain sounds, or a music sound. That is, the environmental sound is a sound generated outside the housing of the imaging apparatus 100 or a sound of the optical lens 300 generated outside the housing.

The noise microphone 201c is an example of a second microphone. The noise microphone 201c is a microphone for acquiring a noise generated inside the housing of the imaging apparatus 100 and a noise generated inside a housing of the optical lens 300. The noise generated inside the housing of the imaging apparatus 100 is a noise of a driving sound that is generated from a predetermined noise source. Examples of the predetermined noise source include a driving member typified by a motor, such as an ultrasonic motor (hereinafter, "USM") and a stepper motor (hereinafter, "STM"). The noise from the predetermined noise source is a vibration sound generated by driving the motor, such as the USM or the STM. For example, the motor is driven in an AF process for adjusting the focus on the object. The imaging apparatus 100 acquires noise, such as a driving sound generated inside the housing of the imaging apparatus 100 and a driving sound generated inside the housing of the optical lens 300, using the noise microphone 201c. The imaging apparatus 100 generates noise parameters using sound data on the acquired noise. The L-microphone 201a, the R-microphone 201b, and the noise microphone 201c are non-directional microphones. An example of the placement of the L-microphone 201a, the R-microphone 201b, and the noise microphone 201c will be described below with reference to FIG. 4.

Each of the L-microphone 201a, the R-microphone 201b, and the noise microphone 201c generates an analog sound signal from acquired sound and inputs the analog sound signal to an amplification unit 202. The sound signal input from the L-microphone 201a is represented as "Lch", the sound signal input from the R-microphone 201b is represented as "Rch", and the sound signal input from the noise microphone 201c is represented as "Nch".

The amplification unit 202 amplifies amplitudes of the analog sound signals input from the L-microphone 201a, the R-microphone 201b, and the noise microphone 201c. The amplification unit 202 amplifies the amplitude of each of the analog sound signals based on gain. A gain (hereinafter, an "amplification amount A") for the analog sound signals input from the L-microphone 201a and the R-microphone 201b is a fixed value (a predetermined amount). A gain (hereinafter, an "amplification amount B") for the analog sound signal input from the noise microphone 201c is appropriately changed according to a signal from a level detection unit 204 or the lens control unit 102. The details of the method for changing the gain for the analog sound signal input from the noise microphone 201c will be described with reference to FIGS. 5 to 8.

An A/D conversion unit 203 converts the analog sound signal amplified by the amplification unit 202 into a digital sound signal. The A/D conversion unit 203 outputs the converted digital sound signal to a fast Fourier transform (FFT) unit 205. The A/D conversion unit 203 executes a sampling process at a sampling frequency of 48 kHz and a bit depth of 16 bits, to convert the analog sound signal into the digital sound signal.

The FFT unit 205 performs a fast Fourier transform process on the digital sound signal input from the A/D conversion unit 203, to convert the time domain digital sound signal into a frequency domain digital sound signal. The frequency domain digital sound signal at a frequency range from 0 Hz to 48 kHz has a frequency spectrum of 1024 points. Further, the frequency domain digital sound signal at a frequency range from 0 Hz to 24 kHz, which is the Nyquist frequency, has a frequency spectrum of 513 points. The imaging apparatus 100 performs a noise reduction process, using a frequency spectrum of 513 points at the frequency range from 0 Hz to 24 kHz, on sound data output from the FFT unit 205.

The frequency spectrum of the sound signal Lch obtained by the fast Fourier transform is pieces of sequence data of 513 points, namely sequence data Lch_Before[0] to Lch_Before[512]. These pieces of sequence data are collectively referred to as sequence data "Lch_Before". The frequency spectrum of the sound signal Rch obtained by the fast Fourier transform is pieces of sequence data of 513 points, namely sequence data Rch_Before[0] to Rch_Before[512]. These pieces of sequence data are collectively referred to as sequence data "Rch_Before". Each of the sequence data Lch_Before and the sequence data Rch_Before is an example of first frequency spectrum data.

The frequency spectrum of the sound signal Nch obtained by the fast Fourier transform is pieces of sequence data of 513 points, namely sequence data Nch_Before[0] to Nch_Before[512]. These pieces of sequence data are collectively referred to as sequence data "Nch_Before". The sequence data Nch_Before is an example of second frequency spectrum data.

Based on the sequence data Nch_Before, a noise data generation unit 206 generates data to be used for reducing noise included in the sequence data Lch_Before and Rch_Before. The noise data generation unit 206 uses noise parameters to generate pieces of sequence data NL[0] to NL[512] to be used for reducing noise included in the pieces of sequence data Lch_Before[0] to Lch_Before[512], respectively. The noise data generation unit 206 also generates pieces of sequence data NR[0] to NR[512] to be used for reducing noise included in the pieces of sequence data Rch_Before[0] to Rch_Before[512], respectively. The number of frequency points of the sequence data NL[0] to NL[512] is the same as the number of frequency points of the sequence data Lch_Before[0] to Lch_Before[512]. The number of frequency points of the sequence data NR[0] to NR[512] is the same as the number of frequency points of the sequence data Rch_Before[0] to Rch_Before[512].

The pieces of sequence data NL[0] to NL[512] are collectively referred to as sequence data "NL". The pieces of sequence data NR[0] to NR[512] are collectively referred to as sequence data "NR". Each of the sequence data NL and the sequence data NR is an example of third frequency spectrum data.

In a case where the amplification amounts A and B are different from each other, the noise data generation unit 206 corrects noise parameters generated by the noise data generation unit 206 by using the amplification amounts A and B. Based on a difference between the amplification amounts A and B, the noise data generation unit 206 corrects the noise parameters generated by the noise data generation unit 206.

In a noise parameter recording unit 207, noise parameters that is used by the noise data generation unit 206 to generate the sequence data NL and NR from the sequence data Nch_Before are recorded. In the noise parameter recording unit 207, a plurality of types of noise parameters each corresponding to a different type of noise is recorded. The noise parameters for generating the sequence data NL from the sequence data Nch_Before are collectively referred to as noise parameters "PLx". The noise parameters for generating the sequence data NR from the sequence data Nch_Before are collectively referred to as noise parameters "PRx".

Each of the noise parameters PLx and PRx has the same numbers of pieces of sequence data as the corresponding one of the sequence data NL and NR. More specifically, a noise parameter PL1 is pieces of sequence data PL1[0] to PL1[512]. The number of frequency points of PL1 is the same as the number of frequency points of the sequence data Lch_Before. A noise parameter PR1 is pieces of sequence data PR1[0] to PR1[512]. The number of frequency points of PR1 is the same as the number of frequency points of the sequence data Rch_Before. The noise parameters will be described below with reference to FIG. 5.

Based on noise parameters recorded in the noise parameter recording unit 207, the noise data generation unit 206 determines noise parameters to be used by the noise data generation unit 206. In the noise parameter recording unit 207, coefficients for 513 points of a frequency spectrum are recorded as the noise parameters. Alternatively, in the noise parameter recording unit 207, instead of coefficients of 513 points for all frequencies, at least coefficients for frequency points required to reduce noise may be recorded. More specifically, in the noise parameter recording unit 207, coefficients for respective frequencies in a frequency spectrum from 20 Hz to 20 kHz, which are considered as typical audible frequencies, may be recorded as the noise parameters, and coefficients for other frequency spectra may not be recorded. Further, for example, coefficients for a frequency spectrum in which values of coefficients are zero may not be recorded as the noise parameters in the noise parameter recording unit 207.

A subtraction processing unit 208 subtracts the sequence data NL and NR from the sequence data Lch_Before and Rch_Before, respectively. For example, the subtraction processing unit 208 includes an L-subtractor 208a that subtracts the sequence data NL from the sequence data Lch_Before, and an R-subtractor 208b that subtracts the sequence data NR from the sequence data Rch_Before. The L-subtractor 208a subtracts the sequence data NL from the sequence data Lch_Before and outputs pieces of sequence data of 513 points, namely sequence data Lch_After[0] to Lch_After[512]. These pieces of sequence data are collectively referred to as sequence data "Lch_After". The R-subtractor 208b subtracts the sequence data NR from the sequence data Rch_Before and outputs pieces of sequence data of 513 points, namely sequence data Rch_After[0] to Rch_After[512]. These pieces of sequence data are collectively referred to as sequence data "Rch_After". The subtraction processing unit 208 executes the subtraction process using a spectral subtraction method.

An inverse fast Fourier transform (iFFT) unit 209 performs inverse fast Fourier transform (inverse Fourier transform) on a frequency domain digital sound signal input from the subtraction processing unit 208, to convert the frequency domain digital sound signal into a time domain digital sound signal.

A sound processing unit 210 executes sound processing, such as an equalizer process, an auto level controller process, and a stereo feeling enhancement process, on the time domain digital sound signal. The sound processing unit 210 outputs sound data obtained by performing the sound processing to the volatile memory 105.

The imaging apparatus 100 includes two microphones as the first microphone. The imaging apparatus 100, however, may include a single microphone or three or more microphones as the first microphone. For example, in a case where the imaging apparatus 100 includes a single microphone as the first microphone in the sound input unit 104, sound data collected by the single microphone is recorded using a monaural method. For example, in a case where the imaging apparatus 100 includes three or more microphones as the first microphone in the sound input unit 104, pieces of sound data collected by the three or more microphones are recorded using a surround method.

While, in the present exemplary embodiment, the L-microphone 201a, the R-microphone 201b, and the noise microphone 201c are non-directional microphones, these microphones may be directional microphones.

<Placement of Microphones in Sound Input Unit 104>

Figure 4:
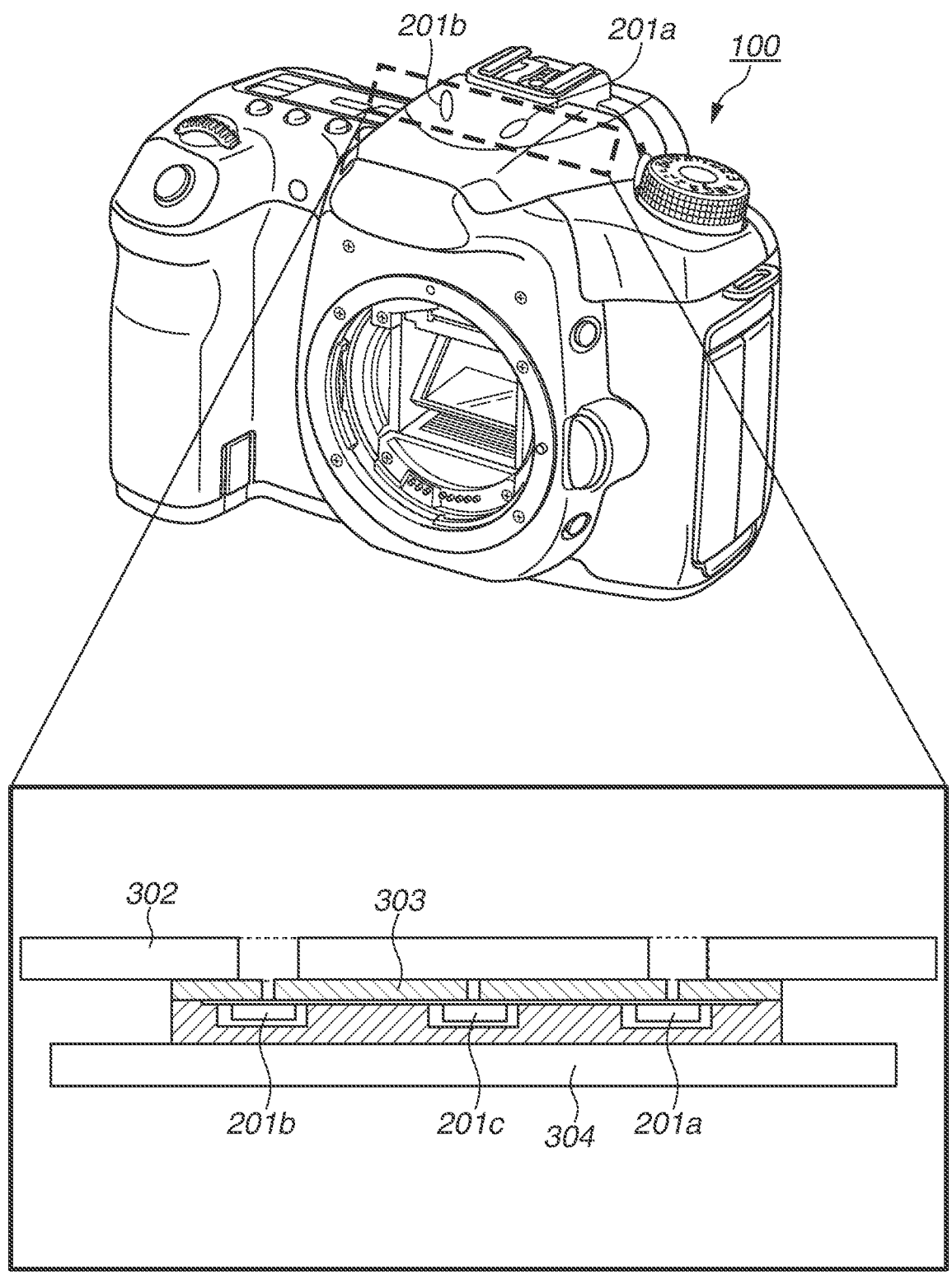
FIG. 4 is a diagram illustrating placement of microphones in the sound input unit of the imaging apparatus according to the present exemplary embodiment.

An example of the placement of the microphones in the sound input unit 104 is described. FIG. 4 illustrates an example of the placement of the L-microphone 201a, the R-microphone 201b, and the noise microphone 201c.

FIG. 4 is an example of a cross-sectional view of a portion of the imaging apparatus 100 to which the L-microphone 201a, the R-microphone 201b, and the noise microphone 201c are provided. This portion of the imaging apparatus 100 includes an exterior portion 302, a microphone bush 303, and a fixing portion 304.

The exterior portion 302 has holes for inputting an environmental sound to the microphones (hereinafter referred to as "microphone holes"). In the present exemplary embodiment, the exterior portion 302 have the microphone holes each above corresponding one of the L-microphone 201a and the R-microphone 201b. On the other hand, the noise microphone 201c is provided to acquire a driving sound generated inside the housing of the imaging apparatus 100 and a driving sound generated inside the housing of the optical lens 300, and does not need to acquire an environmental sound. Thus, the exterior portion 302 does not have a microphone hole above the noise microphone 201c.

The driving sounds generated inside the housing of the imaging apparatus 100 and the housing of the optical lens 300 are acquired by the L-microphone 201a and the R-microphone 201b through the microphone holes. In a case where the driving sounds is generated inside the housing of the imaging apparatus 100 and the housing of the optical lens 300 in the state where the environmental sound is small, a sound acquired by each of the microphones is mainly the driving sounds. Consequently, the level of the sound acquired by the noise microphone 201c is higher than the levels of the sounds acquired by the L-microphone 201a and the R-microphone 201b. That is, in this case, the relationships between the levels of sound signals output from the microphones are as follows.

$$Lch \approx Rch < Nch$$

In a case where the environmental sound becomes large, the levels of the sounds acquired by the L-microphone 201a and the R-microphone 201b based on the environmental sound are higher than the level of the sound acquired by the noise microphone 201c based on the driving sound generated inside the imaging apparatus 100 or the optical lens 300. Consequently, in this case, the relationships between the levels of the sound signals output from the microphones are as follows.

$$Lch \approx Rch > Nch$$

While, in the present exemplary embodiment, the shape of each of the microphone holes in the exterior portion 302 is an ellipse, the shape may be, for example, a circle or a square. The shape of the microphone hole above the L-microphone 201a and the shape of the microphone hole above the R-microphone 201b may be different from each other.

The noise microphone 201c is disposed in proximity to the L-microphone 201a and the R-microphone 201b. The noise microphone 201c is disposed between the L-microphone 201a and the R-microphone 201b such that the noise microphone 201c is almost at an equal distance from both of the L-microphone 201a and the R-microphone 201b. Because of this placement, sound signals generated by the noise microphone 201c from the driving sounds generated inside the housing of the imaging apparatus 100 and the housing of the optical lens 300 become signals similar to sound signals generated by the L-microphone 201a and the R-microphone 201b from the driving sounds.

The microphone bush 303 is a member to which the L-microphone 201a, the R-microphone 201b, and the noise microphone 201c are fixed. The fixing portion 304 is a member that fixes the microphone bush 303 to the exterior portion 302.

The exterior portion 302 and the fixing portion 304 are formed of mold members of a polycarbonate (PC) material. Alternatively, the exterior portion 302 and the fixing portion 304 may be formed of metal members of aluminum or stainless steel. The microphone bush 303 is formed of a rubber material, such as ethylene propylene diene rubber.

<Amplification Amount Setting Process>

Figure 5:
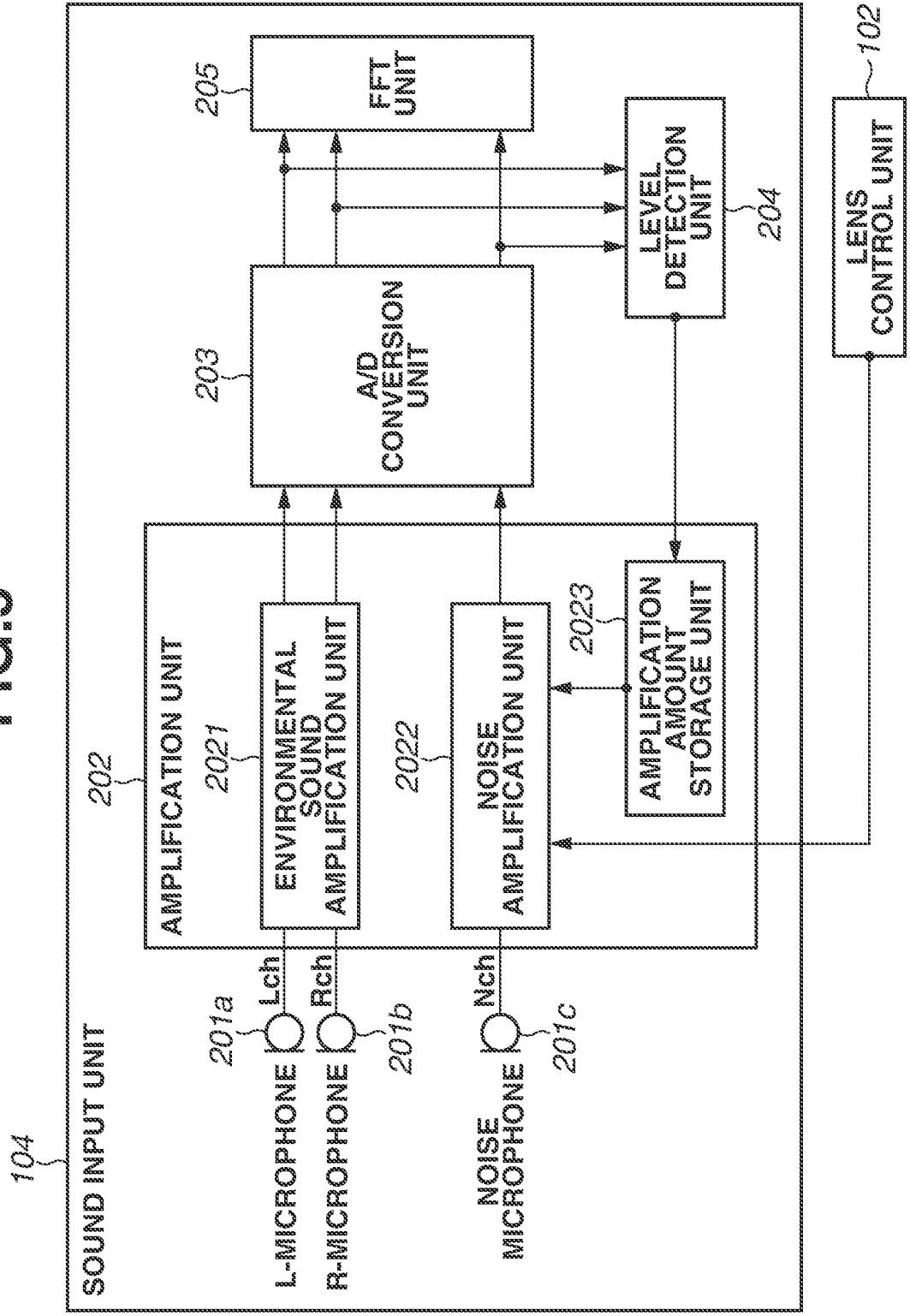
FIG. 5 is a block diagram illustrating an amplification unit according to the present exemplary embodiment.

FIG. 5 is an example of a block diagram illustrating the amplification unit 202.

The amplification unit 202 includes an environmental sound amplification unit 2021, a noise amplification unit 2022, and an amplification amount storage unit 2023 that stores amplification amount updated data.

The environmental sound amplification unit 2021 amplifies sound signals input from the L-microphone 201a and the R-microphone 201b. A gain of the environmental sound amplification unit 2021 is the amplification amount A (dB).

The noise amplification unit 2022 amplifies a sound signal input from the noise microphone 201c. A gain of the noise amplification unit 2022 is the amplification amount B (dB). In accordance with detection contents detected by the level detection unit 204 and the lens control unit 102, the noise amplification unit 2022 sets the amplification amount B of the sound signal input from the noise microphone 201c.

The amplification amount storage unit 2023 is a memory that stores amplification amount updated data.

The level detection unit 204 detects amplitudes (sound pressure levels) of respective sound signal converted by the A/D conversion unit 203, and determines the gain used by the noise amplification unit 2022 based on the detected amplitudes. The lens control unit 102 outputs a signal indicating that a lens attached to the imaging apparatus 100 is being driven.

<Amplification Amount Change Process Using Level Detection Unit 204>

Figure 6:
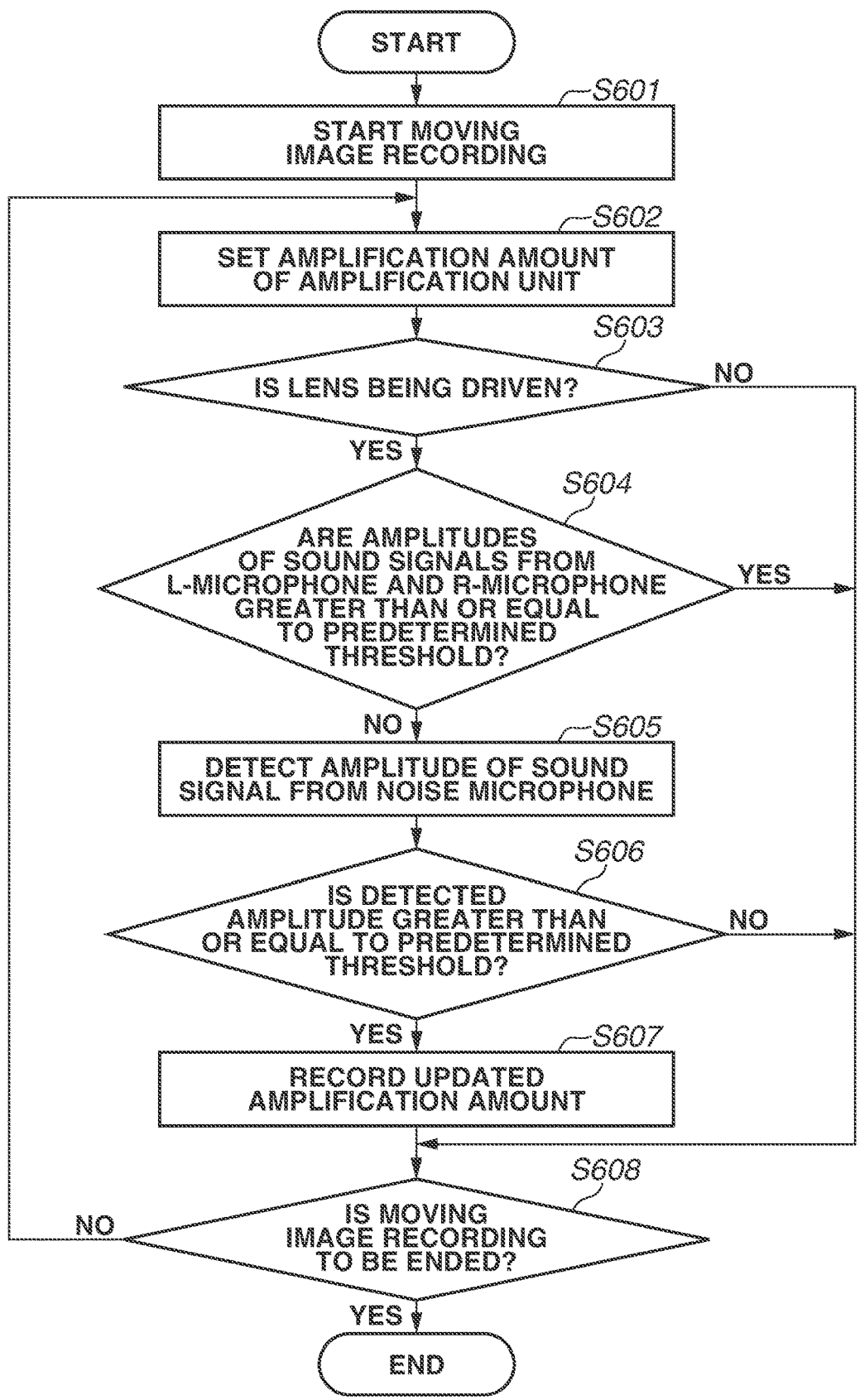
FIG. 6 is a flowchart illustrating control in a case where an amplification amount is changed using a level detection unit according to the present exemplary embodiment.

FIG. 6 is a flowchart illustrating an example of an amplification amount change process by the amplification unit 202 in a case where the level detection unit 204 is used. The processing in FIG. 6 is achieved by the control unit 111 controlling the components. The processing in FIG. 6 is started in response to the operation unit 112 receiving an instruction to start moving image recording from the user. For example, in response to detection of a pressing operation performed on the release switch 61, the control unit 111 starts moving image recording.

In step S601, the control unit 111 starts an image capturing process using the image capturing unit 101 and sound processing using the sound input unit 104. A video obtained by the image capturing process and a sound obtained by the sound processing are sequentially recorded in the recording medium 110.

In step S602, the sound input unit 104 sets a gain stored in the amplification amount storage unit 2023 as the amplification amount B. When the processing procedure of the flowchart in FIG. 6 is started, a gain having a predetermined value (an initial value) has been stored in the amplification amount storage unit 2023. An initial value of the amplification amount B is equal to the amplification amount A. For example, the initial value of the amplification amount B is +10 dB.

In step S603, the sound input unit 104 determines whether the optical lens 300 is being driven. For example, based on a signal input from the lens control unit 102, the sound input unit 104 determines whether the motor is driving the optical lens 300. In a case where the motor is driving the optical lens 300, a signal indicating driving of the motor to perform AF or zooming, for example, is input from the lens control unit 102. In a case where the sound input unit 104 determines that the optical lens 300 is being driven (YES in step S603), the processing proceeds to step S604. In a case where the sound input unit 104 determines that the optical lens 300 is not being driven (NO in step S603), the processing proceeds to step S608.

In step S604, the level detection unit 204 determines whether amplitudes (sound pressure levels) of sound signals input from the L-microphone 201a and the R-microphone 201b are greater than or equal to a predetermined threshold. In a case where the level detection unit 204 determines that the amplitudes of the sound signals input from the L-microphone 201a and the R-microphone 201b are greater than or equal to the predetermined threshold (YES in step S604), the processing proceeds to step S608. In a case where the level detection unit 204 determines that the amplitudes of the sound signals input from the L-microphone 201a and the R-microphone 201b are not greater than or equal to the predetermined threshold (NO in step S604), the processing proceeds to step S605.

In step S605, the level detection unit 204 detects an amplitude of a sound signal input from the noise microphone 201c.

In step S606, the level detection unit 204 determines whether the amplitude of the sound signal from the noise microphone 201c detected in step S605 is greater than or equal to a predetermined threshold. In a case where the amplitude of the sound signal detected in step S605 is greater than or equal to the predetermined threshold (YES in step S606), the processing proceeds to step S607. In a case where the amplitude of the sound signal detected in step S605 is not greater than or equal to the predetermined threshold (NO in step S606), the processing proceeds to step S608.

In step S607, the level detection unit 204 changes the amplification amount B based on the amplitude of the sound signal detected in step S605 and records the changed amplification amount B in the amplification amount storage unit 2023. The amplification amount B of a case where the optical lens 300 is not being driven is the maximum value. Thus, the amplification amount B changed in step S607 has a value smaller than the initial value. The level detection unit 204 changes the amplification amount B to a value smaller than the initial value by a predetermined amount. For example, the level detection unit 204 changes the amplification amount B to −10 dB, which is a value smaller than the initial value by 20 dB. The noise amplification unit 2022 changes the level of the sound signal from the noise microphone 201c based on the amplification amount B newly calculated and recorded in the amplification amount storage unit 2023 by the level detection unit 204.

In step S608, the control unit 111 determines whether the moving image recording is to be ended. For example, in a case where the release switch 61 is pressed by the user, or in a case where a remaining capacity of the recording medium 110 is small, the control unit 111 determines that the moving image recording is to be ended. In a case where the control unit 111 determines that the moving image recording is to be ended (YES in step S608), the processing in this flowchart ends. In a case where the control unit 111 determines that the moving image recording is not to be ended (NO in step S608), the processing returns to step S602.

This is the description of the amplification amount changing method using the level detection unit 204.

<Amplification Amount Change Process Using Lens Control Unit 102>

Figure 7:
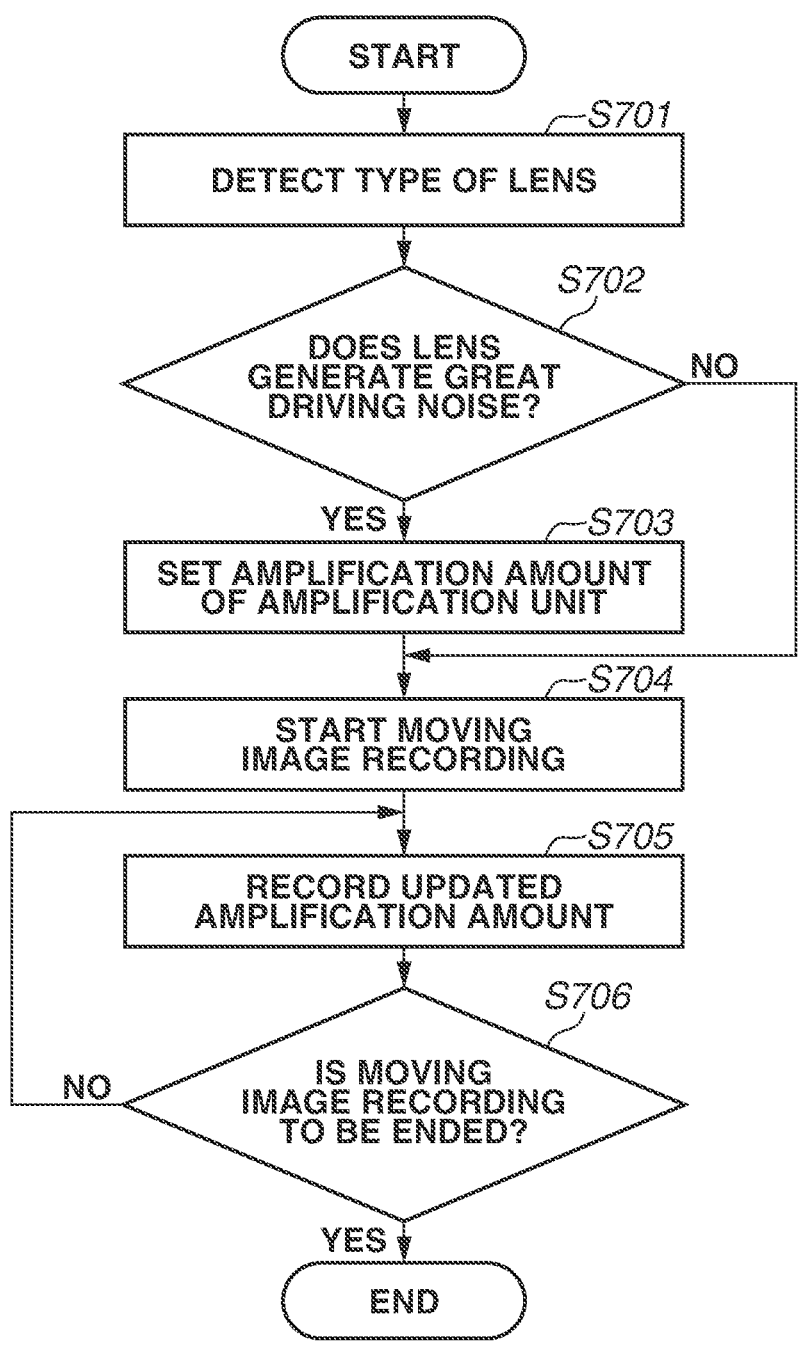
FIG. 7 is a flowchart illustrating control in a case where the amplification amount is changed using a lens control unit according to the present exemplary embodiment.

FIG. 7 is a flowchart illustrating an example of an amplification amount change process by the amplification unit 202 in a case where the lens control unit 102 is used. The processing of the flowchart in FIG. 7 is achieved by the control unit 111 controlling the components. The processing in FIG. 7 is started by the operation unit 112 receiving an instruction to start moving image recording from the user. For example, in response to detection of a pressing operation performed on the release switch 61, the control unit 111 starts moving image recording.

In step S701, the lens control unit 102 detects the type of the optical lens 300 attached to the imaging apparatus 100. Information indicating the type of the lens detected by the lens control unit 102 is input to the noise amplification unit 2022. In step S702, based on the type of the lens detected by the lens control unit 102, the noise amplification unit 2022 determines whether the optical lens 300 is a lens that generates a great driving noise. In a case where the noise amplification unit 2022 determines that the optical lens 300 is a lens that generates a great driving noise (YES in step S702), the processing proceeds to step S703. In a case where the noise amplification unit 2022 determines that the optical lens 300 is not a lens that generates a great driving noise (NO in step S702), the processing proceeds to step S704.

In step S703, the noise amplification unit 2022 changes the amplification amount B based on the type of the optical lens 300 input from the lens control unit 102. The amplification amount B corresponding to the optical lens 300 that generates a small driving noise is the maximum value. For example, the amplification amount B corresponding to the optical lens 300 that generates a small driving noise is +10 dB. Thus, the amplification amount B changed in step S703 has a value smaller than the maximum value. The noise amplification unit 2022 reads the maximum value of the amplification amount B stored in the amplification amount storage unit 2023. Then, the noise amplification unit 2022 changes the amplification amount B to a value smaller than the maximum value by a predetermined amount. For example, the noise amplification unit 2022 changes the amplification amount B to −10 dB, which is a value smaller than the maximum value by 20 dB. The noise amplification unit 2022 changes the level of a sound signal from the noise microphone 201c based on the changed amplification amount B.

In step S704, the control unit 111 starts an image capturing process using the image capturing unit 101 and sound processing using the sound input unit 104. A video obtained by the image capturing process and a sound obtained by the sound processing are sequentially recorded in the recording medium 110.

In step S705, the noise amplification unit 2022 stores the changed amplification amount B in the amplification amount storage unit 2023.

In step S706, the control unit 111 determines whether the moving image recording is to be ended. For example, in a case where the release switch 61 is pressed by the user, or in a case where the remaining capacity of the recording medium 110 is small, the control unit 111 determines that the moving image recording is to be ended. In a case where the control unit 111 determines that the moving image recording is to be ended (YES in step S706), the processing in this flowchart ends. In a case where the control unit 111 determines that the moving image recording is not to be ended (NO in step S706), the processing returns to step S705.

This is the description of the amplification amount change method using the lens control unit 102.

<Amplification Amount Change Process Using Level Detection Unit 204 and Lens Control Unit 102>

Figure 8:
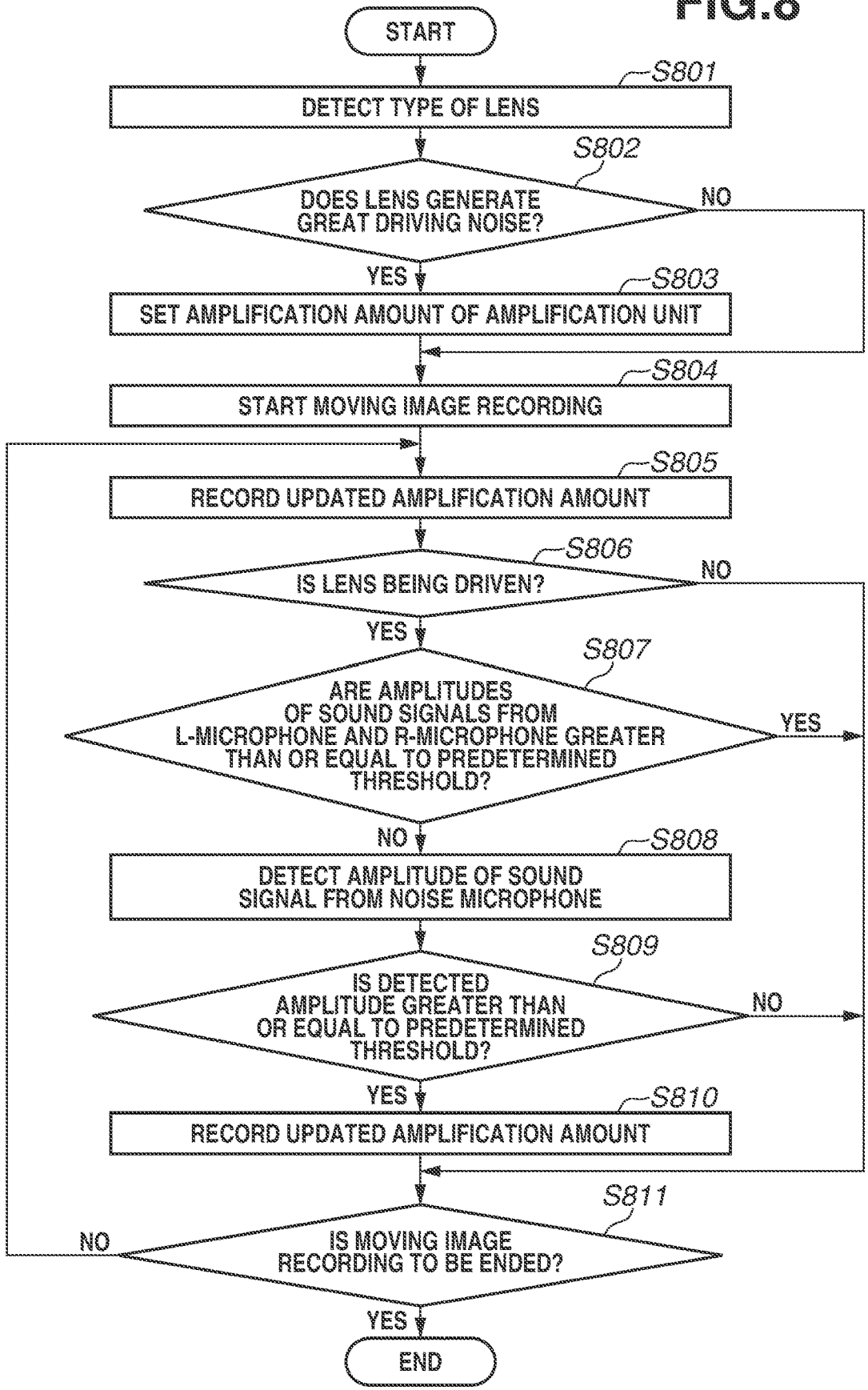
FIG. 8 is a flowchart illustrating control in a case where the amplification amount is changed using the level detection unit and the lens control unit according to the present exemplary embodiment.

FIG. 8 is a flowchart illustrating an example of an amplification amount change process by the amplification unit 202 in a case where both the level detection unit 204 and the lens control unit 102 are used. The processing in FIG. 8 is achieved by the control unit 111 controlling the components. The processing in FIG. 8 is started by the operation unit 112 receiving an instruction to start moving image recording from the user. For example, in response to detection of a pressing operation performed on the release switch 61, the control unit 111 starts moving image recording.

In step S801, the lens control unit 102 detects the type of the optical lens 300 attached to the imaging apparatus 100. Information indicating the type of the lens detected by the lens control unit 102 is input to the noise amplification unit 2022. In step S802, based on the type of the lens detected by the lens control unit 102, the noise amplification unit 2022 determines whether the optical lens 300 is a lens that generates a great driving noise. In a case where the noise amplification unit 2022 determines that the optical lens 300 is a lens that generates a great driving noise (YES in step S802), the processing proceeds to step S803. In a case where the noise amplification unit 2022 determines that the optical lens 300 is not a lens that generates a great driving noise (NO in step S802), the processing proceeds to step S804.

In step S803, the noise amplification unit 2022 changes the amplification amount B based on the type of the optical lens 300 input from the lens control unit 102. The amplification amount B corresponding to the optical lens 300 that generates a small driving noise is the maximum value. For example, the amplification amount B corresponding to the optical lens 300 that generates a small driving noise is +10 dB. Thus, the amplification amount B changed in step S803 has a value smaller than the maximum value. The noise amplification unit 2022 reads the maximum value of the amplification amount B stored in the amplification amount storage unit 2023. Then, the noise amplification unit 2022 changes the amplification amount B to a value smaller than the maximum value by a predetermined amount. For example, the noise amplification unit 2022 changes the amplification amount B to −10 dB, which is a value smaller than the maximum value by 20 dB. The noise amplification unit 2022 changes the level of a sound signal from the noise microphone 201c based on the changed amplification amount B.

In step S804, the control unit 111 starts an image capturing process using the image capturing unit 101 and sound processing using the sound input unit 104. A video obtained by the image capturing process and a sound obtained by the sound processing are sequentially recorded in the recording medium 110.

In step S805, the noise amplification unit 2022 stores the changed amplification amount B in the amplification amount storage unit 2023.

In step S806, the sound input unit 104 determines whether the optical lens 300 is being driven. For example, based on a signal input from the lens control unit 102, the sound input unit 104 determines whether the motor is driving the optical lens 300. In a case where the motor is driving the optical lens 300, a signal indicating driving of the motor to perform AF or zooming, for example, is input from the lens control unit 102. In a case where the sound input unit 104 determines that the optical lens 300 is being driven (YES in step S806), the processing proceeds to step S807. In a case where the sound input unit 104 determines that the optical lens 300 is not being driven (NO in step S806), the processing proceeds to step S811.

In step S807, the level detection unit 204 determines whether amplitudes (sound pressure levels) of sound signals input from the L-microphone 201a and the R-microphone 201b are greater than or equal to a predetermined threshold. In a case where the level detection unit 204 determines that the amplitudes of the sound signals input from the L-microphone 201a and the R-microphone 201b are greater than or equal to the predetermined threshold (YES in step S807), the processing proceeds to step S811. In a case where the level detection unit 204 determines that the amplitudes of the sound signals input from the L-microphone 201a and the R-microphone 201b are not greater than or equal to the predetermined threshold (NO in step S807), the processing proceeds to step S808.

In step S808, the level detection unit 204 detects an amplitude of a sound signal input from the noise microphone 201c.

In step S809, the level detection unit 204 determines whether the amplitude of the sound signal detected in step S808 is greater than or equal to a predetermined threshold. In a case where the amplitude of the sound signal detected in step S808 is greater than or equal to the predetermined threshold (YES in step S809), the processing proceeds to step S810. In a case where the amplitude of the sound signal detected in step S808 is not greater than or equal to the predetermined threshold (NO in step S809), the processing proceeds to step S811.

In step S810, the level detection unit 204 reads the amplification amount B stored in the amplification amount storage unit 2023. Then, in a case where the amplification amount B is the maximum value, the level detection unit 204 changes the amplification amount B and records the changed amplification amount B in the amplification amount storage unit 2023. In a case where the noise amplification unit 2022 determines in step S802 that the optical lens 300 is not a lens that generates a great driving noise, the maximum value is recorded as the amplification amount B in the amplification amount storage unit 2023. Thus, in this case, the level detection unit 204 changes the amplification amount B to the value smaller than the maximum value by the predetermined amount. The noise amplification unit 2022 changes the level of the sound signal from the noise microphone 201c based on the changed amplification amount B.

In a case where the noise amplification unit 2022 determines in step S802 that the optical lens 300 is a lens that generates a great driving noise, then in step S803, the amplification amount B is already changed to the value smaller than the maximum value by the predetermined amount. Thus, the level detection unit 204 does not change the value of the amplification amount B. The noise amplification unit 2022 changes the level of the sound signal from the noise microphone 201c without changing the value of the amplification amount B. In step S811, the control unit 111 determines whether the moving image recording is to be ended. For example, in a case where the release switch 61 is pressed by the user, or in a case where the remaining capacity of the recording medium 110 is small, the control unit 111 determines that the moving image recording is to be ended. In a case where the control unit 111 determines that the moving image recording is to be ended (YES in step S811), the processing in this flowchart ends. In a case where the control unit 111 determines that the moving image recording is not to be ended (NO in step S811), the processing returns to step S805.

This is the description of the amplification amount change process using the level detection unit 204 and the lens control unit 102.

As described above, according to the level of a sound signal including driving noise from the noise microphone 201c or the type of the optical lens 300, the imaging apparatus 100 sets the amplification amount B of a sound signal from the noise microphone 201c. With this configuration, the amplification amount of noise included in the noise microphone 201c can be appropriately controlled. Consequently, the imaging apparatus 100 can effectively reduce noise.

The imaging apparatus 100 may appropriately determine which of the amplification amount change process using the level detection unit 204 or the lens control unit 102 or both the level detection unit 204 and the lens control unit 102 is to be used.

<Noise Parameters>

FIG. 9 is examples of noise parameters recorded in the noise parameter recording unit 207. As described above, a sound signal acquired by the noise microphone 201c includes a driving sound generated inside the housing of the imaging apparatus 100 and a driving sound generated inside the housing of the optical lens 300 as noise. The noise parameters are parameters to be used for reducing the noise included in the sound signal from the noise microphone 201c. As illustrated in FIG. 3, the noise parameters PLx and PRx are recorded in the noise parameter recording unit 207. A description will be given of a case where the driving sound is generated inside the housing of the optical lens 300. The driving sound generated inside the housing of the optical lens 300 is transmitted into the housing of the imaging apparatus 100 via the lens mount 301 and acquired by the L-microphone 201a, the R-microphone 201b, and the noise microphone 201c.

Driving sound frequency differs among types of the driving sound. Thus, the imaging apparatus 100 stores a plurality of noise parameters each corresponding to a different type of driving sound (noise). The imaging apparatus 100 generates noise data using any of the plurality of noise parameters. The imaging apparatus 100 records a noise parameter for white noise as constant noise. The imaging apparatus 100 also reduces noise other than constant noise. Examples of noise parameters stored in the imaging apparatus 100 include a noise parameter for short-term noise that is generated by the meshing of gears in the optical lens 300. The imaging apparatus 100 also stores a noise parameter for a sliding contact sound within the housing of the optical lens 300 as long-term noise.

Additionally, the imaging apparatus 100 records a noise parameter for noise generated in a case where the A/D conversion unit 203 performs A/D conversion on sound data, as quantization noise.

The imaging apparatus 100 may record a noise parameter for each type of the optical lens 300, each temperature within the housing of the imaging apparatus 100 that is detected by the information acquisition unit 103, and each tilt of the imaging apparatus 100.

<Noise Data Generation Process>

With reference to FIGS. 10A to 10C. and 11A to 11D, a description will be given of a noise data generation process by the noise data generation unit 206. Although a noise data generation process regarding data on the sound signal Lch is described here, the same applies to a noise data generation method regarding data on the sound signal Rch.

First, a description will be given of a process of generating a noise parameter in a situation where it can be considered that there is no environmental sound. FIG. 10A illustrates an example of the frequency spectrum of sequence data Lch_Before in a case where a driving sound is generated inside the housing of the optical lens 300 in a situation where it can be considered that there is no environmental sound. FIG. 10B illustrates an example of the frequency spectrum of sequence data Nch_Before in the case where the driving sound is generated inside the housing of the optical lens 300 in the situation where it can be considered that there is no environmental sound. Each horizontal axis represents the frequencies from the 0th point to the 512th point. Each vertical axis represents the amplitude of the frequency spectrum.

Under the situation where it can be considered that there is no environmental sound, the amplitudes of the frequency spectra of the sequence data Lch_Before and Nch_Before are great in the same frequency range. Since the driving sound is generated inside the housing of the optical lens 300, with respect to the same driving sound, the amplitude of the frequency spectrum of the sequence data Nch_Before tends to be greater than the amplitude of the frequency spectrum of sequence data Lch_Before.

FIG. 10C illustrates an example of the noise parameters PLx. The noise parameters PLx is coefficients of frequencies obtained by dividing the amplitudes of the frequencies in the frequency spectrum of the sequence data Lch_Before acquired in the situation where it can be considered that there is no environmental sound, by the amplitudes of the frequencies in the frequency spectrum of the sequence data Nch_Before respectively. The result of the division is represented as sequence data "Lch_Before/Nch_Before". That is, noise parameters PLx is the ratio between the amplitudes of the sequence data Lch_Before and Nch_Before in the state where there is no environmental sound. In the noise parameter recording unit 207, values of sequence data Lch_Before/Nch_Before is recorded as the noise parameters PLx. As described above, with respect to the same driving sound, since the amplitudes of the frequency spectrum of the sequence data Nch_Before tend to be greater than the amplitudes of the frequency spectrum of the sequence data Lch_Before, the value of the coefficients of the noise parameters PLx tends to be a value smaller than 1. However, in a case where the value of sequence data Nch_Before[n] is smaller than a predetermined threshold, the noise parameter recording unit 207 records the noise parameters PLx as PLx[n]=0.

Next, a description will be given of a process of applying a generated noise parameter to the sequence data Nch_Before. FIG. 11A illustrates an example of the frequency spectrum of sequence data Lch_Before in a case where a driving sound is generated inside the housing of the optical lens 300 in a situation where there is an environmental sound.

FIG. 11B illustrates an example of the frequency spectrum of sequence data Nch_Before in the case where the driving sound is generated inside the housing of the optical lens 300 in the situation where there is an environmental sound. Each horizontal axis represents the frequencies from the 0th point to the 512th point. Each vertical axis represents the amplitude of the frequency spectrum.

FIG. 11C illustrates an example of NL in the case where the driving sound is generated inside the housing of the optical lens 300 in the situation where there is an environmental sound. The noise data generation unit 206 multiplies each of the frequencies in the frequency spectrum of the sequence data Nch_Before by corresponding one of the coefficients of the noise parameters PLx, to generate the sequence data NL. The sequence data NL is a frequency spectrum generated in this manner.

FIG. 11D illustrates an example of sequence data Lch_After in the case where the driving sound is generated inside the housing of the optical lens 300 in the situation where there is an environmental sound. The subtraction processing unit 208 subtracts the sequence data NL from the sequence data Lch_Before, respectively, to generate sequence data Lch_After. The sequence data Lch_After is a frequency spectrum generated in this manner.

Consequently, the imaging apparatus 100 can reduce noise caused by a driving sound generated inside the housing of the optical lens 300 and record an environmental sound with less noise.

A description will be given of a noise data generation process by the noise data generation unit 206 in a case where the amplification unit 202 amplifies sound signals input from the L-microphone 201a and the R-microphone 201b and a sound signal input from the noise microphone 201c by different amplification amounts.

Although a noise data generation process regarding data on the sound signal Lch is described here, the same applies to a noise data generation method regarding data on the sound signal Rch.

First, a description will be given of a noise data generation method in a case where the amplification amount B, which is used by the noise amplification unit 2022, is changed as described above, and a difference occurs between the amplification amount B of the noise amplification unit 2022 and the amplification amount A of the environmental sound amplification unit 2021.

Figure 12:
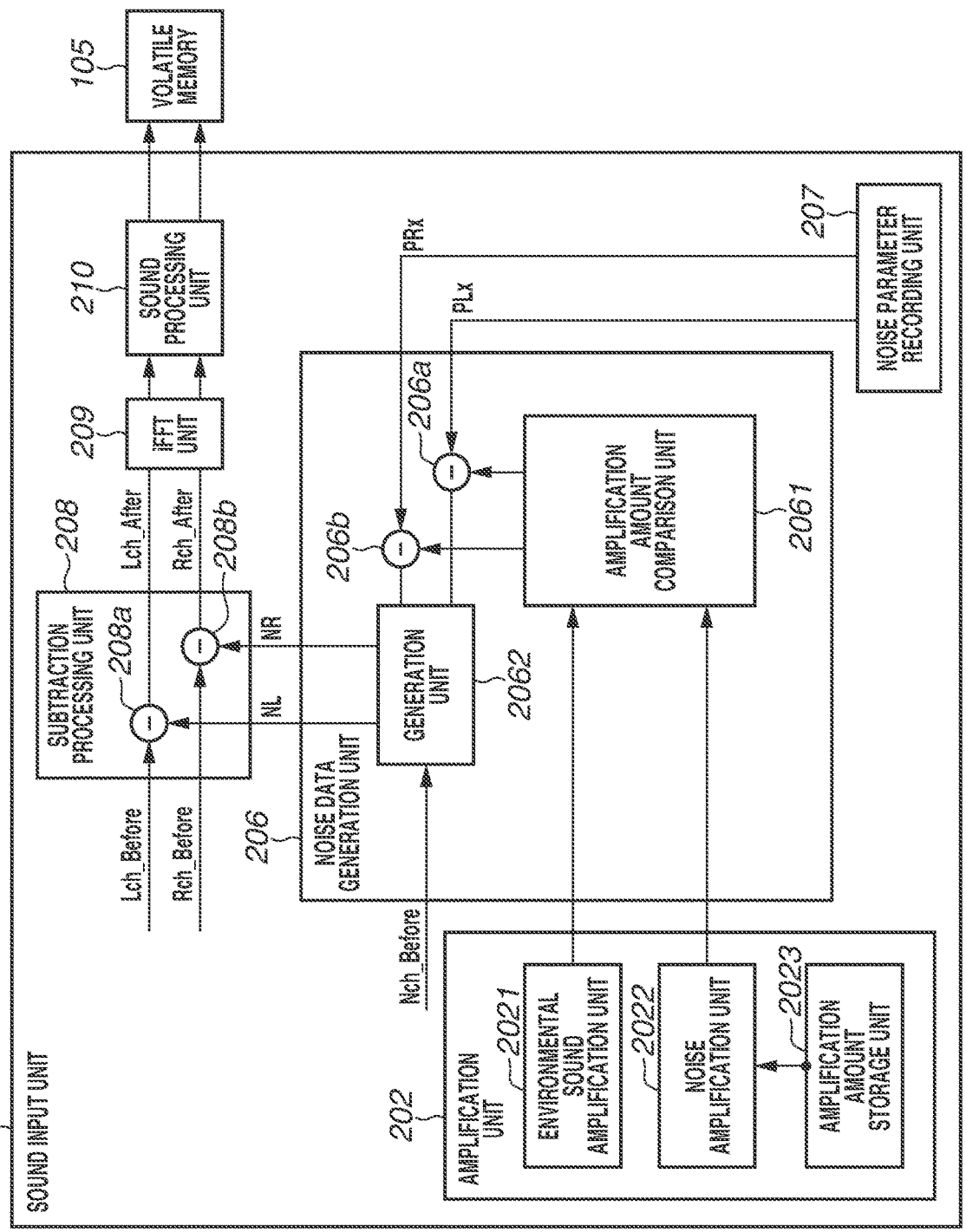
FIG. 12 is a block diagram illustrating a noise data generation process method by a noise data generation unit, according to the present exemplary embodiment.

FIG. 12 is a diagram illustrating the details of the noise data generation unit 206. The noise data generation unit 206 includes an amplification amount comparison unit 2061, a PL subtractor 206a, a PR subtractor 206b, and a generation unit 2062. The amplification amount comparison unit 2061 subtracts the amplification amount A of the environmental sound amplification unit 2021 from the amplification amount B of the noise amplification unit 2022, to acquire the difference between the amplification amounts A and B. Then, the amplification amount comparison unit 2061 sends the difference to the PL subtractor 206a, and the PL subtractor 206a subtracts the difference from the noise parameters PLx. For example, in a case where the amplification amount B of the noise amplification unit 2022 is changed to a value of 0.5 times the initial value, the amplification amount comparison unit 2061 acquires a value changed to the value of 0.5 times the initial value as the amplification amount B from the noise amplification unit 2022. Then, the amplification amount comparison unit 2061 acquires the difference between the value that is 0.5 times the initial value of the amplification amount B and the initial value and sends the difference to the PL subtractor 206a. The PL subtractor 206a subtracts the difference from the value of each coefficient in the spectrum of the noise parameters PLx. By this processing, the sequence data NL to be generated by the generation unit 2062 becomes a parameter in which the difference between the amplification amount B of the noise amplification unit 2022 and the amplification amount A of the environmental sound amplification unit 2021 is corrected.

Figure 13:
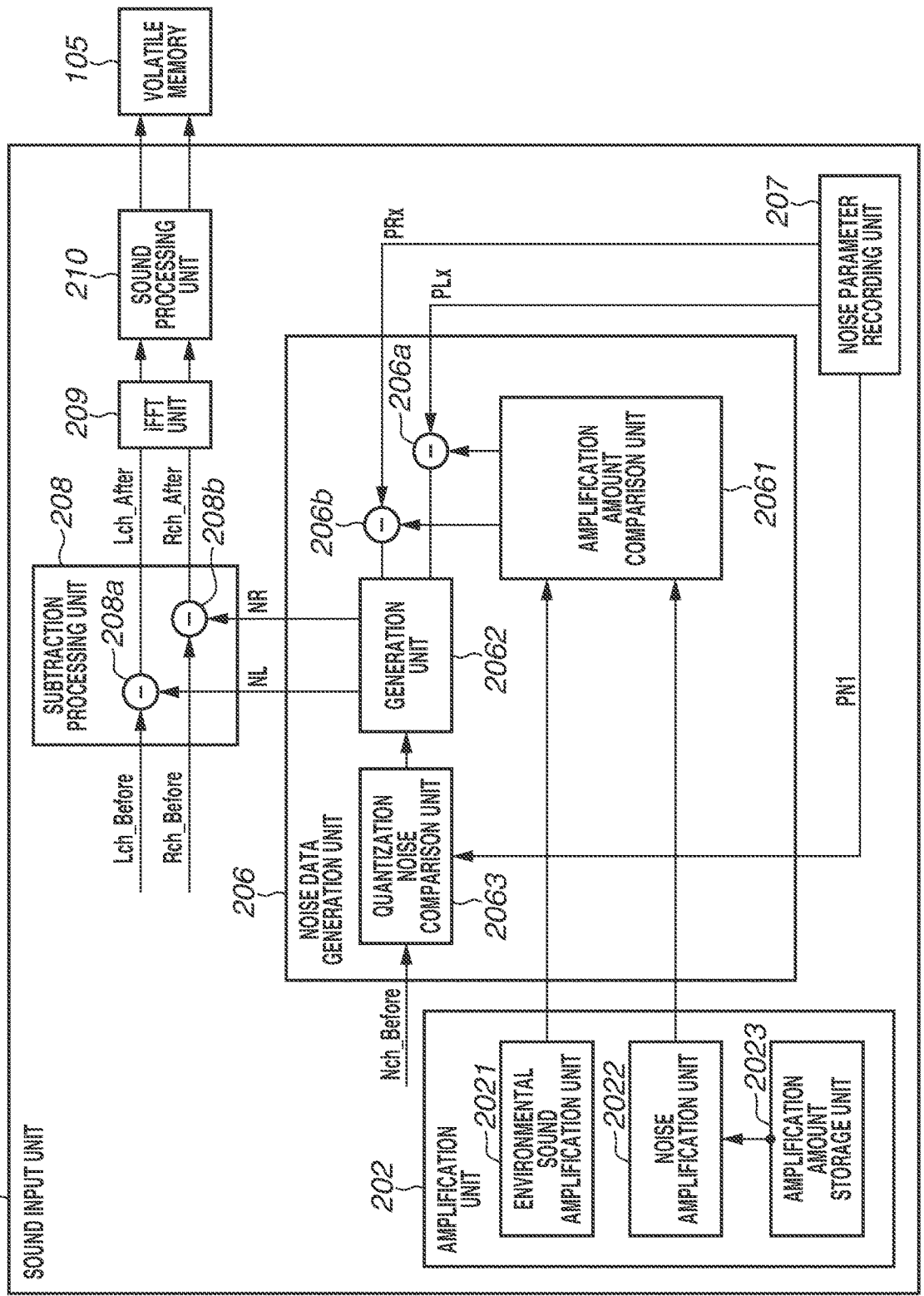
FIG. 13 is a block diagram illustrating a noise data generation process method by the noise data generation unit in a case where a sound signal of a sound collected by a noise microphone is influenced by quantization noise, according to the present exemplary embodiment.

Next, a description will be given of a noise data generation method in a case where quantization noise of the A/D conversion unit 203 is included in the sequence data Nch_Before. FIG. 13 is a diagram illustrating the details of the noise data generation unit 206. The noise data generation unit 206 includes a quantization noise comparison unit 2063, the generation unit 2062, and the amplification amount comparison unit 2061.

In this case, the noise data generation unit 206 generates noise data using a quantization noise parameter. The "quantization noise parameter" refers to, for example, a unique noise spectrum that is generated in a case where the A/D conversion unit 203 converts a sound signal. The quantization noise parameter is recorded in the noise parameter recording unit 207. The quantization noise parameter is a noise parameter "PN1" illustrated in FIG. 9.

FIGS. 14A to 14E are diagrams illustrating a comparison process for comparing the sequence data Nch_Before and the quantization noise parameter. FIGS. 14A to 14E illustrate frequency spectra processed on the same time axis.

FIG. 14A illustrates an example of the frequency spectrum of sequence data Nch_Before in a case where a driving sound is generated inside the housing of the optical lens 300. The horizontal axis represents the frequencies from the 0th point to the 512th point. The vertical axis represents the amplitude of the frequency spectrum.

FIG. 14B illustrates an example of the frequency spectrum of the quantization noise parameter PN1 corresponding to quantization noise generated in a case where the A/D conversion unit 203 converts a sound signal.

FIG. 14C illustrates an example of a frequency spectrum Noise_Lens of the driving sound actually generated inside the housing of the optical lens 300.

FIG. 14D is a diagram illustrating the frequency spectrum, of the driving sound actually generated inside the housing of the optical lens 300, that is included in the frequency spectrum of the sequence data Nch_Before. That is, in the sequence data Nch_Before, samples in each of which gray display remains are samples influenced by the quantization noise. Samples in each of which gray display does not remain are samples in which the driving sound actually generated inside the housing of the optical lens 300 is acquired.

The quantization noise comparison unit 2063 sets the value of the quantization noise parameter PN1 for a sample influenced by the quantization noise to 0. More specifically, for each sample, the quantization noise comparison unit 2063 compares the amplitude of the sequence data Nch_Before and the quantization noise recorded in the noise parameter recording unit 207. Then, if the difference is less than or equal to a predetermined threshold, the quantization noise comparison unit 2063 sets the value of the quantization noise parameter PN1 for the sample to 0.

FIG. 14E illustrates sequence data NL generated by the generation unit 2062 in a case where the value of the quantization noise parameter PN1 for a sample influenced by the quantization noise is set to 0.

In a case where sound data acquired by the noise microphone 201c is influenced by quantization noise of the A/D conversion unit 203, the above processing enables the subtraction processing unit 208 to avoid performing a subtraction process on a range influenced by the quantization noise.

The disclosure is not limited to the above exemplary embodiments as they are, and can be embodied by modifying components without departing from the scope of the disclosure at the stage where the disclosure is carried out. Various embodiments can be formed by appropriately combining a plurality of components discussed in the above exemplary embodiments. For example, some of all the components illustrated in the exemplary embodiments may be deleted. Further, components in different exemplary embodiments may be appropriately combined together.

Embodiment(s) of the disclosure can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2021-091350, filed May 31, 2021, which is hereby incorporated by reference herein in its entirety.

What is claimed is:

1. An apparatus comprising:
a first microphone that acquires an environmental sound;
a second microphone that acquires a noise of a noise source;
a central processing unit (CPU); and
a memory that stores a program that, when executed by the CPU, causes the apparatus to function as:
a first amplification unit configured to amplify a sound signal output from the first microphone;
a second amplification unit configured to amplify a sound signal output from the second microphone, in accordance with an amplification amount, the amplification amount being set based on at least one of a level of the sound signal output from the second amplification unit and a type of the noise source;
a first conversion unit configured to perform Fourier transform on the sound signal output from the first amplification unit, to generate first sound data;
a second conversion unit configured to perform Fourier transform on the sound signal output from the second amplification unit, to generate second sound data;
a noise data generation unit configured to generate noise data based on the second sound data;
a reduction unit configured to reduce noise corresponding to the noise source from the first sound data using the noise data; and
a third conversion unit configured to perform inverse Fourier transform on the first sound data output from the reduction unit,
wherein, when the amplification amount is set based on the type of the noise source and the level of the sound data output from the second amplification unit, the amplification amount is set, in a case where the noise source is a first noise source, to a first value, and the amplification amount is set, in a case where the noise source is a second noise source that generates noise greater than noise of the first noise source, to a second value smaller than the first value, and
wherein, in a case where a level of the sound signal amplified in accordance with the amplification amount having the first value by the second amplification unit and output from the second amplification unit is greater than or equal to a threshold, the amplification amount is changed from the first value to a value smaller than the first value.

2. The apparatus according to claim 1, wherein, when the second amplification unit amplifies the sound signal output from the second microphone in accordance with the amplification amount having the first value and the amplification amount is set based on the level of the sound signal output from the second amplification unit, the amplification amount is changed, in a case where the level of the sound signal output from the second amplification unit is greater than or equal to the threshold, from the first value to the value smaller than the first value.

3. The apparatus according to claim 1, wherein, when the second amplification unit amplifies the sound signal output from the second microphone in accordance with the amplification amount having the first value and the amplification amount is set based on the level of the sound signal output from the second amplification unit, the amplification amount is changed, in a case where the level of the sound signal output from the first amplification unit is not greater than or equal to a predetermined level and a level of the sound signal output from the second amplification unit is greater than or equal to the threshold, from the first value the value smaller than the first value.

4. The apparatus according to claim 1, wherein the noise source is a motor included in a lens.

5. The apparatus according to claim 4, wherein the amplification amount is set in accordance with a type of the lens.

6. The apparatus according to claim 1,
wherein the program, when executed by the CPU, further causes the apparatus to function as:
a first analog-to-digital (AD) conversion unit configured to convert the sound signal output from the first amplification unit into a digital signal; and
a second AD conversion unit configured to convert the sound signal output from the second amplification unit into a digital signal.

7. A method comprising:
acquiring an environmental sound using a first microphone;
acquiring a noise of a noise source using a second microphone;
performing a first amplification process for amplifying the sound signal output from the first microphone;
performing a second amplification process for amplifying a sound signal output from the second amplification process, in accordance with an amplification amount, the amplification amount being set based on at least one of a level of the sound signal output from the second amplification process and a type of the noise source;
performing Fourier transform on the sound signal output from the first amplification process to generate first sound data;
performing Fourier transform on the sound signal output from the second amplification process to generate second sound data;
performing a generation process for generating noise data based on the second sound data;

performing a reduction process for reducing noise corresponding to the noise source from the first sound data using the noise data; and performing inverse Fourier transform on the first sound data subjected to the reduction process, wherein, when the amplification amount is set based on the type of the noise source and the level of the sound data output from the second amplification process, the amplification amount is set, in a case where the noise source is a first noise source, to a first value, and the amplification amount is set, in a case where the noise source is a second noise source that generates noise greater than noise of the first noise source, to a second value smaller than the first value, and wherein, in a case where a level of the sound signal amplified in accordance with the amplification amount having the first value by the second amplification process and output from the second amplification process is greater than or equal to a threshold, the amplification amount is changed from the first value to a value smaller than the first value.

8. An apparatus comprising:

a first microphone that acquires an environmental sound;

a second microphone that acquires a noise of a noise source;

a central processing unit (CPU); and a memory that stores a program that, when executed by the CPU, causes the apparatus to function as:

a first amplification unit configured to amplify a sound signal output from the first microphone;

a second amplification unit configured to amplify a sound signal output from the second microphone, in accordance with an amplification amount, the amplification amount being set based on at least one of a level of the sound signal output from the second amplification unit and a type of the noise source;

a first conversion unit configured to perform Fourier transform on the sound signal output from the first amplification unit, to generate first sound data;

a second conversion unit configured to perform Fourier transform on the sound signal output from the second amplification unit, to generate second sound data;

a noise data generation unit configured to generate noise data based on the second sound data;

a reduction unit configured to reduce noise corresponding to the noise source from the first sound data using the noise data; and a third conversion unit configured to perform inverse Fourier transform on the first sound data output from the reduction unit, wherein, in accordance with the set amplification amount, the noise data generation unit changes the noise data to be generated, and wherein the noise data generation unit is configured to generate the noise data based on the second sound data and a noise parameter and change a level of the noise parameter according to the set amplification amount.

* * * * *